US012609151B2

(12) United States Patent
Woo et al.

(10) Patent No.: US 12,609,151 B2
(45) Date of Patent: Apr. 21, 2026

(54) ADDRESS MAPPING FOR IMPROVED RELIABILITY

(71) Applicant: Rambus Inc., San Jose, CA (US)

(72) Inventors: Steven C. Woo, Saratoga, CA (US);
Taeksang Song, San Jose, CA (US)

(73) Assignee: Rambus Inc., San Jose, CA (US)

( * ) Notice: Subject to any disclaimer, the term of this patent is extended or adjusted under 35 U.S.C. 154(b) by 118 days.

(21) Appl. No.: 18/584,669

(22) Filed: Feb. 22, 2024

(65) Prior Publication Data

US 2024/0274181 A1     Aug. 15, 2024

Related U.S. Application Data

(63) Continuation of application No. PCT/US2022/041028, filed on Aug. 22, 2022.

(60) Provisional application No. 63/399,178, filed on Aug. 18, 2022, provisional application No. 63/315,857, filed on Mar. 2, 2022, provisional application No. 63/235,932, filed on Aug. 23, 2021.

(51) Int. Cl.
| | |
|---|---|
| *G06F 12/02* | (2006.01) |
| *G11C 11/406* | (2006.01) |
| *G11C 11/408* | (2006.01) |
| *G11C 11/4093* | (2006.01) |

(52) U.S. Cl.
CPC ...... *G11C 11/40618* (2013.01); *G11C 11/408* (2013.01); *G11C 11/4093* (2013.01)

(58) Field of Classification Search
CPC .................................................. G06F 12/0292
See application file for complete search history.

(56) References Cited

U.S. PATENT DOCUMENTS

| | | | |
|---|---|---|---|
| 5,390,308 | A | 2/1995 | Ware et al. |
| 7,133,960 | B1 | 11/2006 | Thompson et al. |
| 9,236,110 | B2 | 1/2016 | Bains et al. |
| 9,383,927 | B2 | 7/2016 | Thomas |
| 10,580,475 | B2 | 3/2020 | Morohashi et al. |
| 10,636,476 | B2 | 4/2020 | Nale |
| 12,086,060 | B2 * | 9/2024 | Song ................. G11C 11/40611 |

(Continued)

OTHER PUBLICATIONS

Kim, Moonsoo et al., "An Effective DRAM Address Remapping for Mitigating Rowhammer Errors", IEEE Transactions on Computers, vol. 68, No. 10, Oct. 2019, 14 pages.

(Continued)

*Primary Examiner* — Hoai V Ho

(74) *Attorney, Agent, or Firm* — The Neudeck Law Firm, LLC

(57) ABSTRACT

The internal row addressing of each DRAM on a module is mapped such that row hammer affects different neighboring row addresses in each DRAM. Because the external row address to internal row address mapping scheme ensures that each set of neighboring rows for a given externally addressed row is different for each DRAM on the module, row hammering of a given externally addressed row spreads the row hammering errors across different externally addressed rows on each DRAM. This has the effect of confining the row hammer errors for each row that is hammered to a single DRAM per externally addressed neighboring row. By confining the row hammer errors to a single DRAM, the row hammer errors are correctible using a single device data correct (SDDC) scheme.

20 Claims, 16 Drawing Sheets

(56)         References Cited

U.S. PATENT DOCUMENTS

| | | |
|---|---|---|
| 2014/0164676 A1 | 6/2014 | Borchers et al. |
| 2015/0089183 A1* | 3/2015 | Bains .................. G06F 12/0292 |
| | | 711/202 |
| 2016/0224262 A1 | 8/2016 | Mandava et al. |
| 2017/0329549 A1 | 11/2017 | Tuers et al. |
| 2018/0218767 A1 | 8/2018 | Wolff |
| 2019/0371390 A1 | 12/2019 | Ito |
| 2020/0065268 A1 | 2/2020 | Gopalakrishnan et al. |
| 2020/0301590 A1 | 9/2020 | Bell et al. |
| 2021/0109577 A1 | 4/2021 | Mandava et al. |

OTHER PUBLICATIONS

Notification of Transmittal of the International Search Report and the Written Opinion of the International Searching Authority, or the Declaration with Mail Date Jan. 25, 2023 re: Int'l Appln. No. PCT/US2022/041028. 18 pages.
EP Extended European Search Report with Mail Date Jun. 17, 2025 re: Int'l Appln. No. 22861936.7. 10 pages.

* cited by examiner

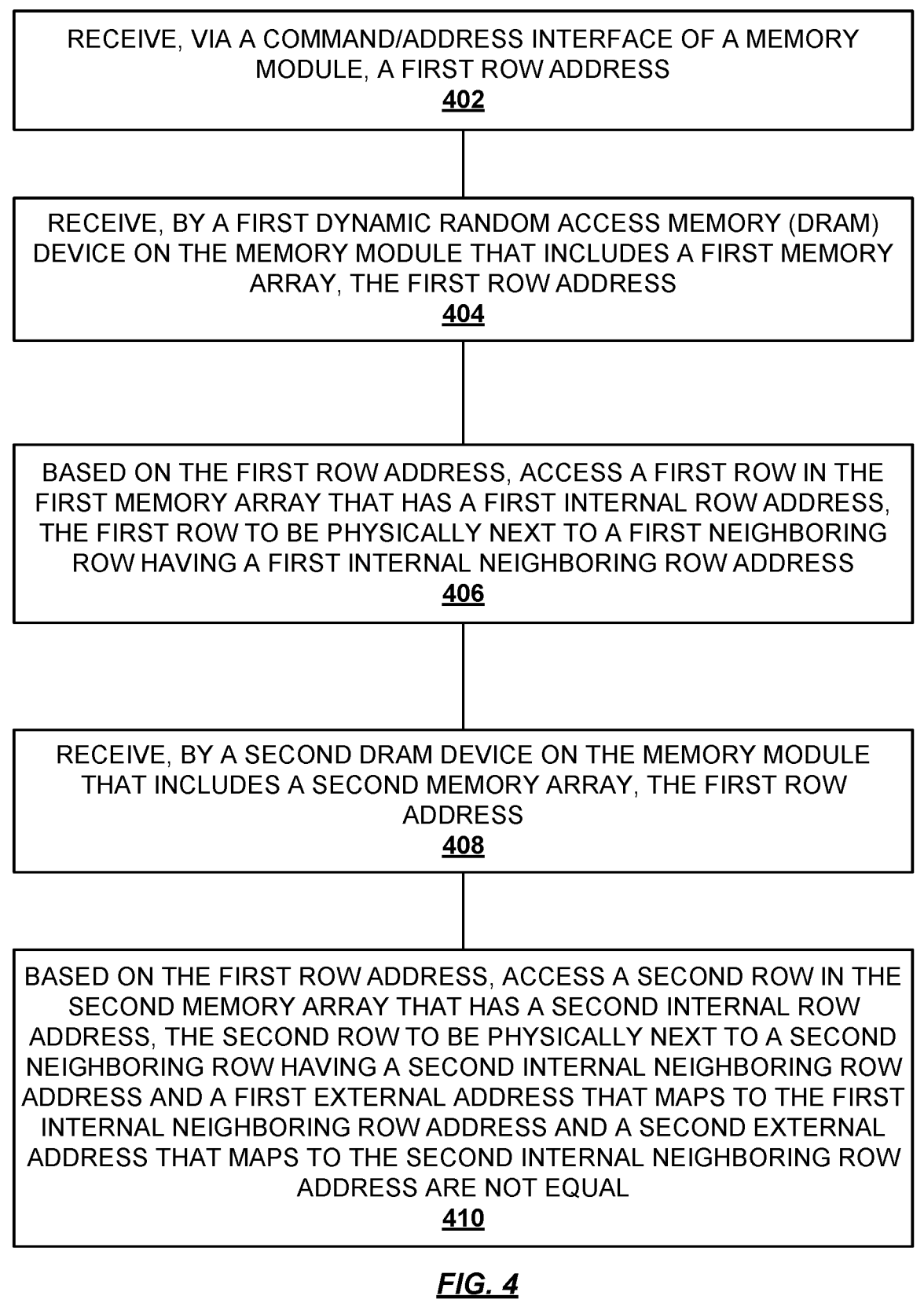

RECEIVE, VIA A COMMAND/ADDRESS INTERFACE OF A MEMORY MODULE, A FIRST ROW ADDRESS
402

RECEIVE, BY A FIRST DYNAMIC RANDOM ACCESS MEMORY (DRAM) DEVICE ON THE MEMORY MODULE THAT INCLUDES A FIRST MEMORY ARRAY, THE FIRST ROW ADDRESS
404

BASED ON THE FIRST ROW ADDRESS, ACCESS A FIRST ROW IN THE FIRST MEMORY ARRAY THAT HAS A FIRST INTERNAL ROW ADDRESS, THE FIRST ROW TO BE PHYSICALLY NEXT TO A FIRST NEIGHBORING ROW HAVING A FIRST INTERNAL NEIGHBORING ROW ADDRESS
406

RECEIVE, BY A SECOND DRAM DEVICE ON THE MEMORY MODULE THAT INCLUDES A SECOND MEMORY ARRAY, THE FIRST ROW ADDRESS
408

BASED ON THE FIRST ROW ADDRESS, ACCESS A SECOND ROW IN THE SECOND MEMORY ARRAY THAT HAS A SECOND INTERNAL ROW ADDRESS, THE SECOND ROW TO BE PHYSICALLY NEXT TO A SECOND NEIGHBORING ROW HAVING A SECOND INTERNAL NEIGHBORING ROW ADDRESS AND A FIRST EXTERNAL ADDRESS THAT MAPS TO THE FIRST INTERNAL NEIGHBORING ROW ADDRESS AND A SECOND EXTERNAL ADDRESS THAT MAPS TO THE SECOND INTERNAL NEIGHBORING ROW ADDRESS ARE NOT EQUAL
410

*FIG. 4*

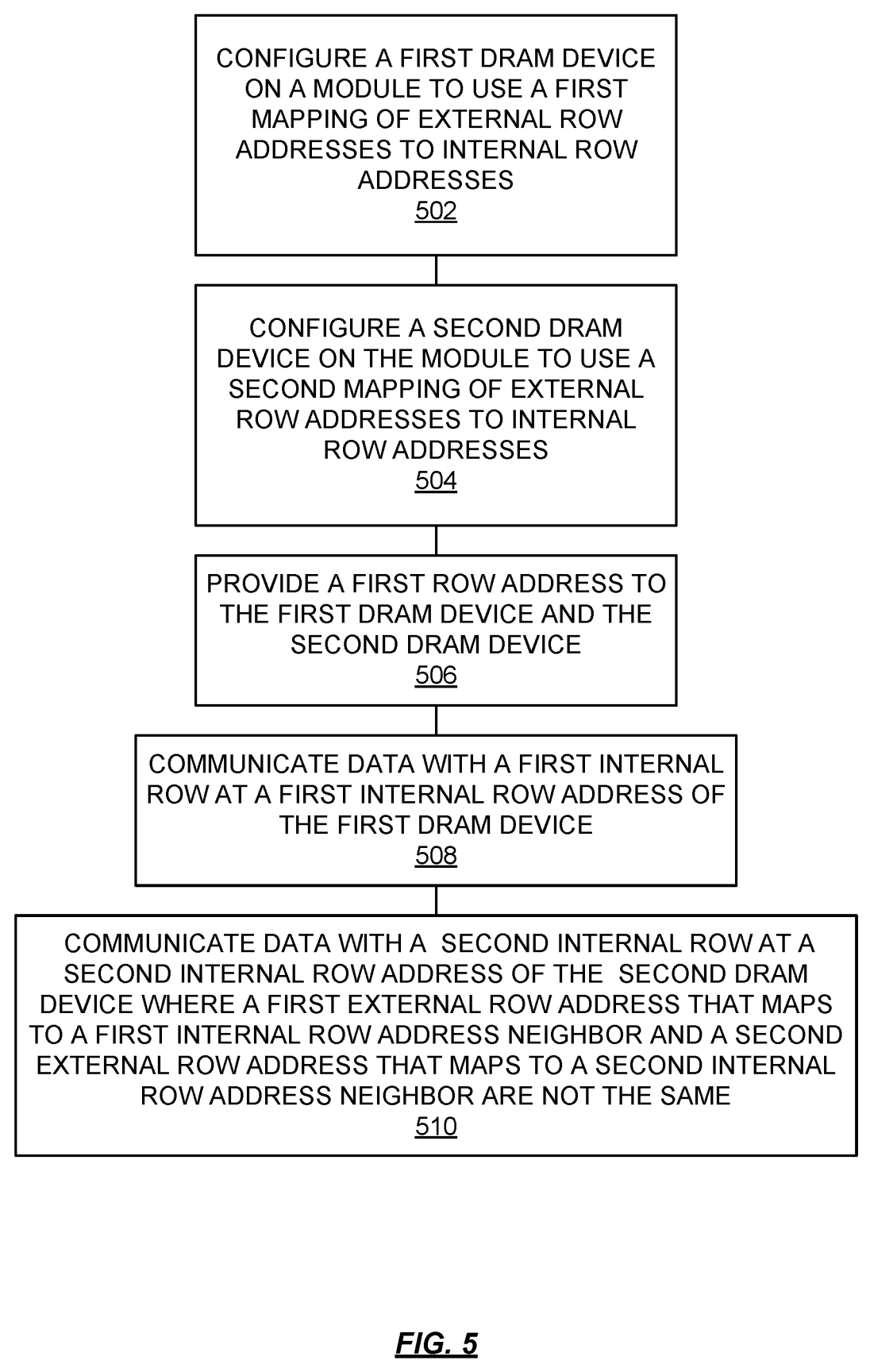

CONFIGURE A FIRST DRAM DEVICE
ON A MODULE TO USE A FIRST
MAPPING OF EXTERNAL ROW
ADDRESSES TO INTERNAL ROW
ADDRESSES
502

CONFIGURE A SECOND DRAM
DEVICE ON THE MODULE TO USE A
SECOND MAPPING OF EXTERNAL
ROW ADDRESSES TO INTERNAL
ROW ADDRESSES
504

PROVIDE A FIRST ROW ADDRESS TO
THE FIRST DRAM DEVICE AND THE
SECOND DRAM DEVICE
506

COMMUNICATE DATA WITH A FIRST INTERNAL
ROW AT A FIRST INTERNAL ROW ADDRESS OF
THE FIRST DRAM DEVICE
508

COMMUNICATE DATA WITH A SECOND INTERNAL ROW AT A
SECOND INTERNAL ROW ADDRESS OF THE SECOND DRAM
DEVICE WHERE A FIRST EXTERNAL ROW ADDRESS THAT MAPS
TO A FIRST INTERNAL ROW ADDRESS NEIGHBOR AND A SECOND
EXTERNAL ROW ADDRESS THAT MAPS TO A SECOND INTERNAL
ROW ADDRESS NEIGHBOR ARE NOT THE SAME
510

*FIG. 5*

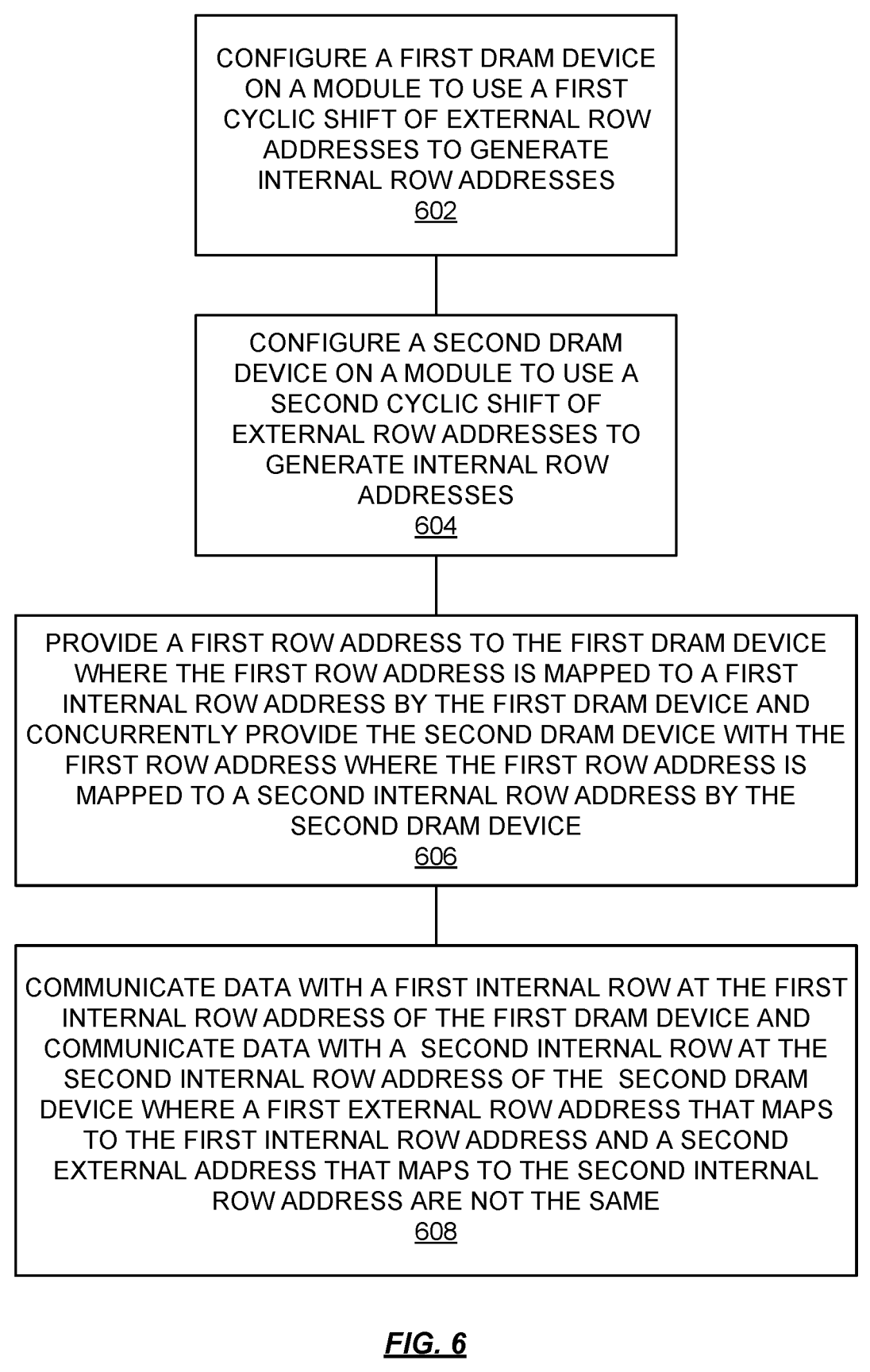

CONFIGURE A FIRST DRAM DEVICE
ON A MODULE TO USE A FIRST
CYCLIC SHIFT OF EXTERNAL ROW
ADDRESSES TO GENERATE
INTERNAL ROW ADDRESSES
602

CONFIGURE A SECOND DRAM
DEVICE ON A MODULE TO USE A
SECOND CYCLIC SHIFT OF
EXTERNAL ROW ADDRESSES TO
GENERATE INTERNAL ROW
ADDRESSES
604

PROVIDE A FIRST ROW ADDRESS TO THE FIRST DRAM DEVICE
WHERE THE FIRST ROW ADDRESS IS MAPPED TO A FIRST
INTERNAL ROW ADDRESS BY THE FIRST DRAM DEVICE AND
CONCURRENTLY PROVIDE THE SECOND DRAM DEVICE WITH THE
FIRST ROW ADDRESS WHERE THE FIRST ROW ADDRESS IS
MAPPED TO A SECOND INTERNAL ROW ADDRESS BY THE
SECOND DRAM DEVICE
606

COMMUNICATE DATA WITH A FIRST INTERNAL ROW AT THE FIRST
INTERNAL ROW ADDRESS OF THE FIRST DRAM DEVICE AND
COMMUNICATE DATA WITH A  SECOND INTERNAL ROW AT THE
SECOND INTERNAL ROW ADDRESS OF THE  SECOND DRAM
DEVICE WHERE A FIRST EXTERNAL ROW ADDRESS THAT MAPS
TO THE FIRST INTERNAL ROW ADDRESS AND A SECOND
EXTERNAL ADDRESS THAT MAPS TO THE SECOND INTERNAL
ROW ADDRESS ARE NOT THE SAME
608

*FIG. 6*

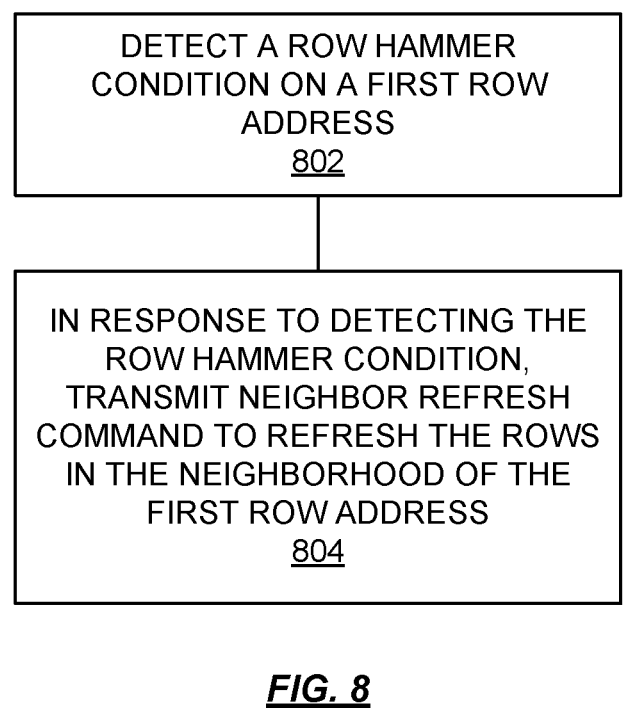

DETECT A ROW HAMMER
CONDITION ON A FIRST ROW
ADDRESS
802

IN RESPONSE TO DETECTING THE
ROW HAMMER CONDITION,
TRANSMIT NEIGHBOR REFRESH
COMMAND TO REFRESH THE ROWS
IN THE NEIGHBORHOOD OF THE
FIRST ROW ADDRESS
804

*FIG. 8*

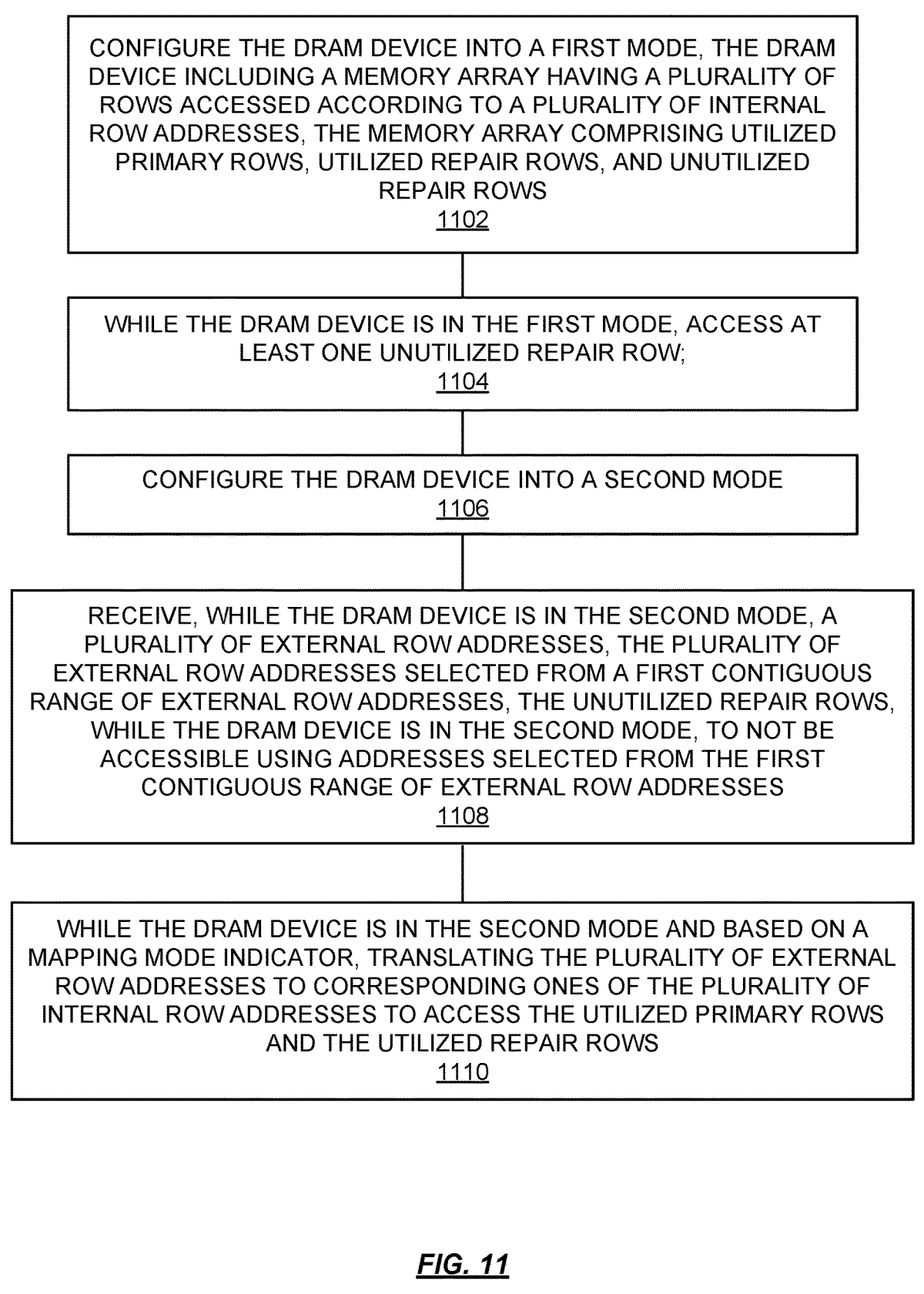

CONFIGURE THE DRAM DEVICE INTO A FIRST MODE, THE DRAM DEVICE INCLUDING A MEMORY ARRAY HAVING A PLURALITY OF ROWS ACCESSED ACCORDING TO A PLURALITY OF INTERNAL ROW ADDRESSES, THE MEMORY ARRAY COMPRISING UTILIZED PRIMARY ROWS, UTILIZED REPAIR ROWS, AND UNUTILIZED REPAIR ROWS
1102

WHILE THE DRAM DEVICE IS IN THE FIRST MODE, ACCESS AT LEAST ONE UNUTILIZED REPAIR ROW;
1104

CONFIGURE THE DRAM DEVICE INTO A SECOND MODE
1106

RECEIVE, WHILE THE DRAM DEVICE IS IN THE SECOND MODE, A PLURALITY OF EXTERNAL ROW ADDRESSES, THE PLURALITY OF EXTERNAL ROW ADDRESSES SELECTED FROM A FIRST CONTIGUOUS RANGE OF EXTERNAL ROW ADDRESSES, THE UNUTILIZED REPAIR ROWS, WHILE THE DRAM DEVICE IS IN THE SECOND MODE, TO NOT BE ACCESSIBLE USING ADDRESSES SELECTED FROM THE FIRST CONTIGUOUS RANGE OF EXTERNAL ROW ADDRESSES
1108

WHILE THE DRAM DEVICE IS IN THE SECOND MODE AND BASED ON A MAPPING MODE INDICATOR, TRANSLATING THE PLURALITY OF EXTERNAL ROW ADDRESSES TO CORRESPONDING ONES OF THE PLURALITY OF INTERNAL ROW ADDRESSES TO ACCESS THE UTILIZED PRIMARY ROWS AND THE UTILIZED REPAIR ROWS
1110

*FIG. 11*

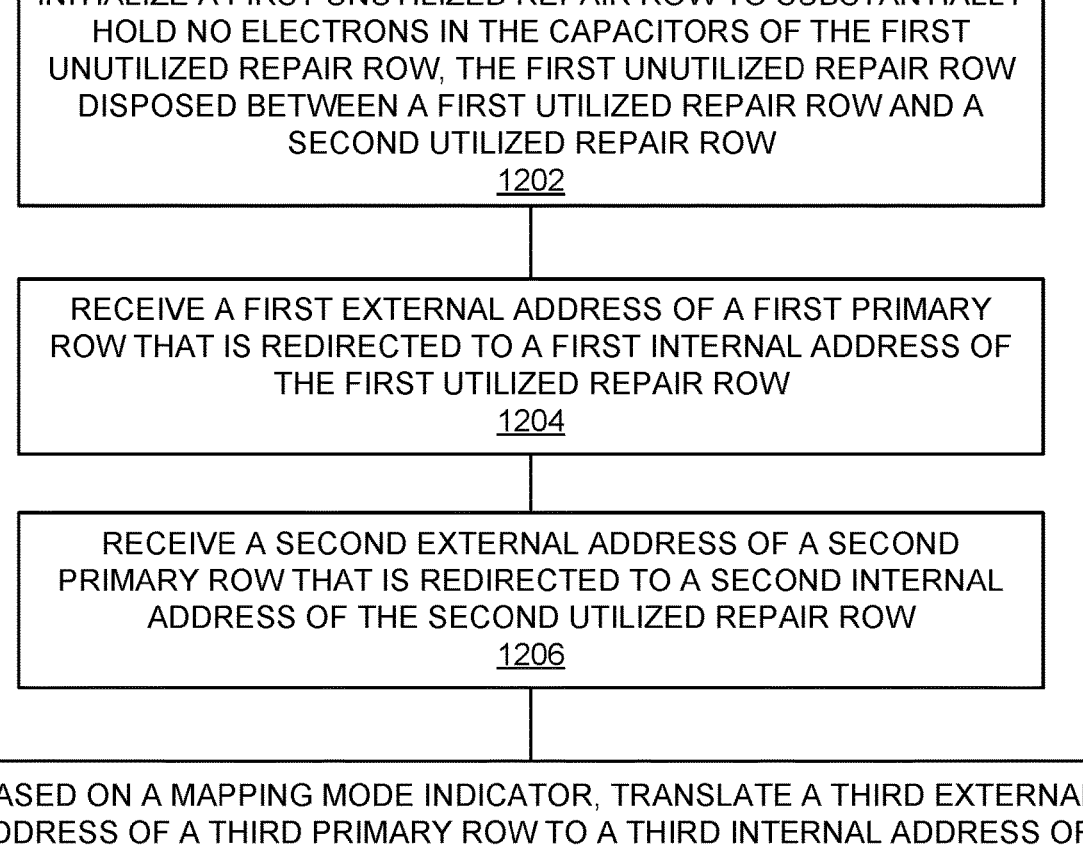

INITIALIZE A FIRST UNUTILIZED REPAIR ROW TO SUBSTANTIALLY HOLD NO ELECTRONS IN THE CAPACITORS OF THE FIRST UNUTILIZED REPAIR ROW, THE FIRST UNUTILIZED REPAIR ROW DISPOSED BETWEEN A FIRST UTILIZED REPAIR ROW AND A SECOND UTILIZED REPAIR ROW
1202

RECEIVE A FIRST EXTERNAL ADDRESS OF A FIRST PRIMARY ROW THAT IS REDIRECTED TO A FIRST INTERNAL ADDRESS OF THE FIRST UTILIZED REPAIR ROW
1204

RECEIVE A SECOND EXTERNAL ADDRESS OF A SECOND PRIMARY ROW THAT IS REDIRECTED TO A SECOND INTERNAL ADDRESS OF THE SECOND UTILIZED REPAIR ROW
1206

BASED ON A MAPPING MODE INDICATOR, TRANSLATE A THIRD EXTERNAL ADDRESS OF A THIRD PRIMARY ROW TO A THIRD INTERNAL ADDRESS OF A THIRD ROW, WHERE WITHOUT THE TRANSLATION BASED ON THE MAPPING MODE INDICATOR, THE THIRD EXTERNAL ADDRESS WOULD ACCESS A FOURTH PRIMARY ROW
1208

*FIG. 12*

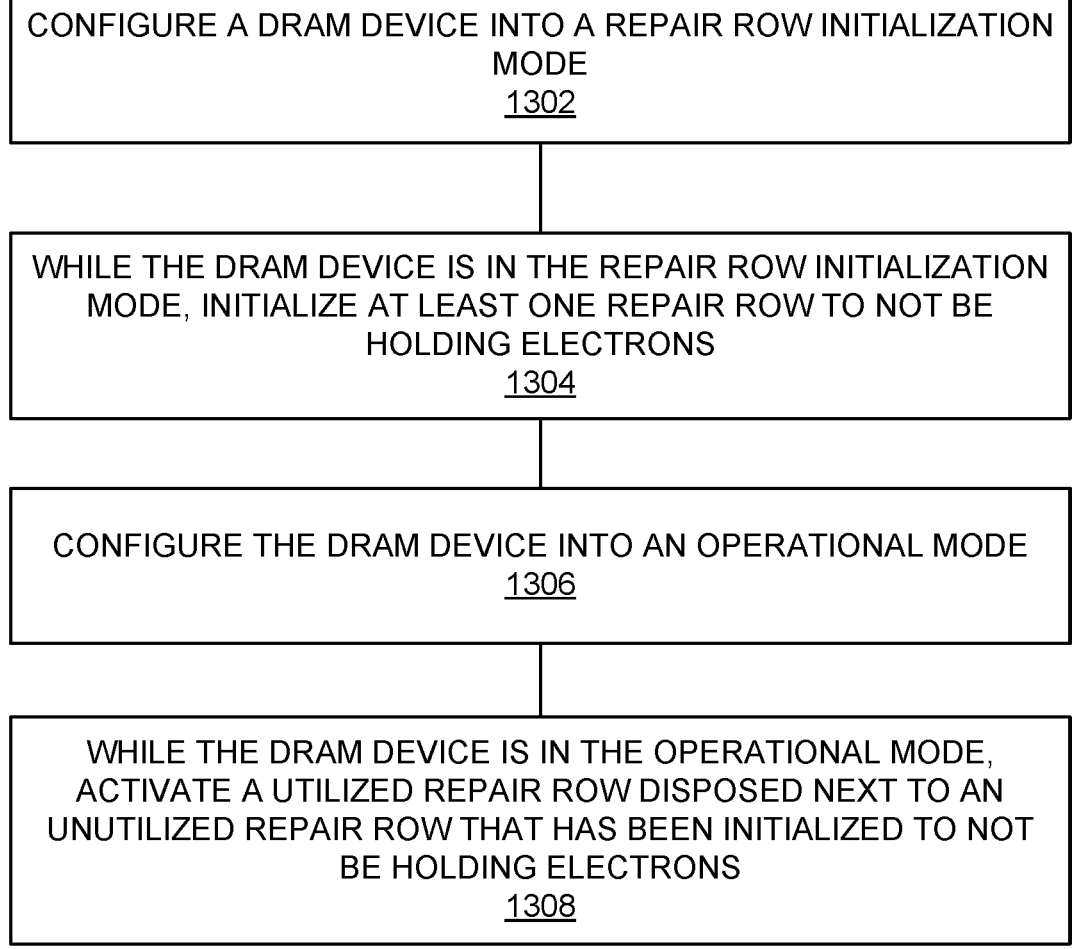

CONFIGURE A DRAM DEVICE INTO A REPAIR ROW INITIALIZATION MODE
1302

WHILE THE DRAM DEVICE IS IN THE REPAIR ROW INITIALIZATION MODE, INITIALIZE AT LEAST ONE REPAIR ROW TO NOT BE HOLDING ELECTRONS
1304

CONFIGURE THE DRAM DEVICE INTO AN OPERATIONAL MODE
1306

WHILE THE DRAM DEVICE IS IN THE OPERATIONAL MODE, ACTIVATE A UTILIZED REPAIR ROW DISPOSED NEXT TO AN UNUTILIZED REPAIR ROW THAT HAS BEEN INITIALIZED TO NOT BE HOLDING ELECTRONS
1308

*FIG. 13*

ADDRESS MAPPING FOR IMPROVED RELIABILITY

BRIEF DESCRIPTION OF THE DRAWINGS

FIG. 4 is a flowchart illustrating a method of operating a memory module.

FIG. 5 is a flowchart illustrating a method of accessing a memory module.

FIG. 6 is a flowchart illustrating a method of accessing different internal rows of different dynamic random access memory (DRAM) devices on a module.

FIG. 8 is a flowchart illustrating a method of mitigating row hammer.

FIG. 11 is a flowchart illustrating a method of operating a memory device.

FIG. 12 is a flowchart illustrating a method of operating a memory device with repair rows.

FIG. 13 is a flowchart illustrating a method of mitigating row hammer of repair rows.

DETAILED DESCRIPTION OF THE EMBODIMENTS

Figure 1:
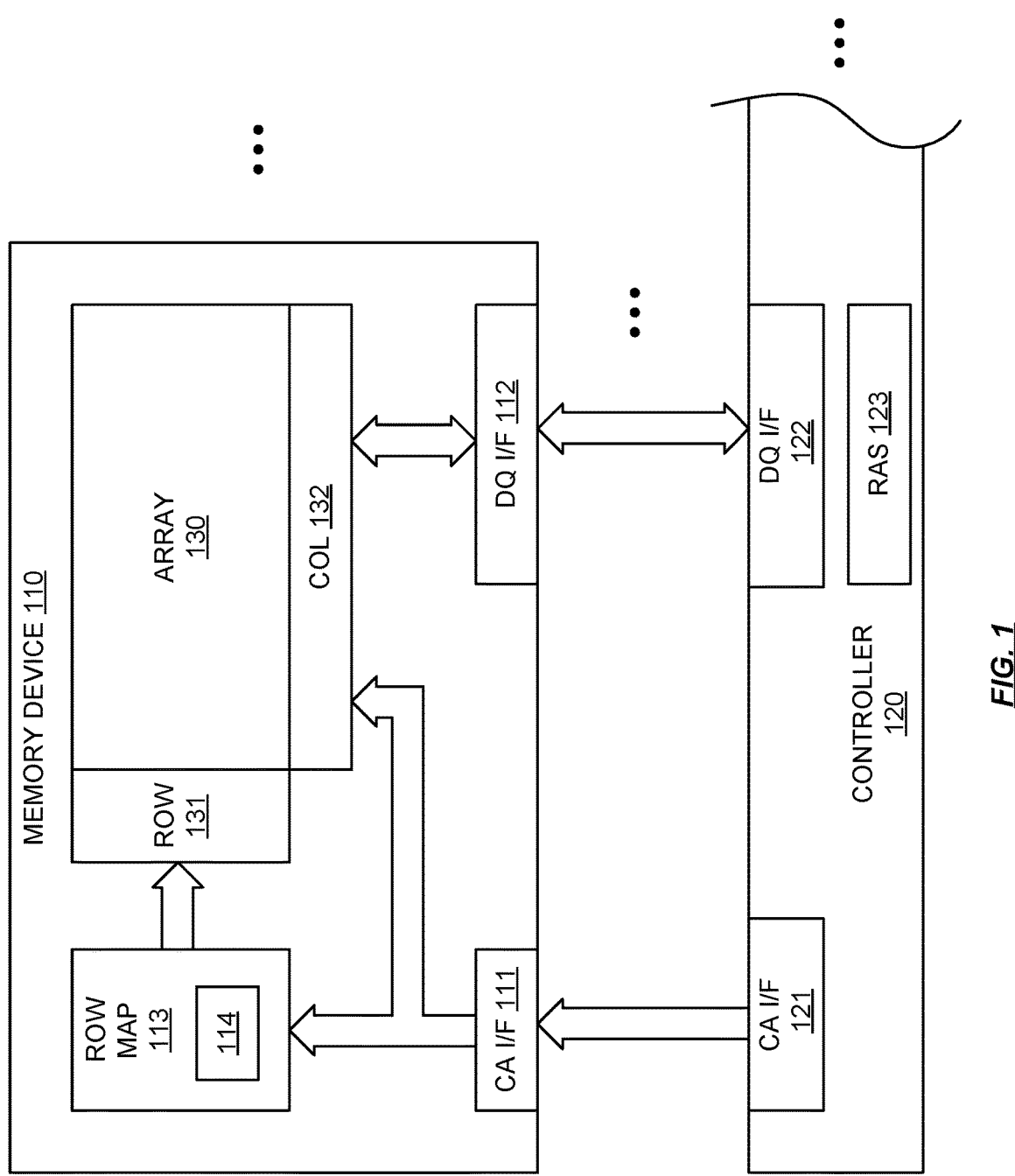
FIG. 1 is a block diagram illustrating a memory system.

Repeated row activations of the same row in a memory device (e.g., dynamic random access memory—DRAM), whether malicious or accidental, may cause cells in the neighborhood of the repeatedly activated row to lose a stored value. This effect on storage reliability has been termed "row hammer." Row hammer, when applied to the multiple, parallel, memory device accesses that occur with memory modules, can cause multiple errors across multiple devices on the module. When many errors occur across multiple memory devices, the error detection and correction schemes of Chipkill (a.k.a., "single device data correct"—SDDC) and SSDC/DSDD (i.e., "single symbol data correct"—SSDC with "double symbol data detect"—DSDD) may be overwhelmed by the number and distribution of errors and thereby unable to correct these row hammer caused errors (or in some cases, detect the errors).

In an embodiment, the internal row addressing of each memory device on a module is mapped such that row hammer affects different neighboring row addresses in each memory device. Thus, because the external row address (i.e., an address received via the command/address interface) to internal row address (i.e., an ordinal row number of the row in the memory core—for example, if the rows of the array are addressed in order, from top to bottom, the internal row address that selects a row from top to bottom are 0, 1, 2, 3, . . . ) mapping scheme ensures that each set of neighboring rows for a given externally addressed row is different for each memory device on the module, row hammering of a given externally addressed row spreads the row hammering errors across different externally addressed rows on each memory device. This has the effect of confining the row hammer errors for each row that is hammered to a single memory device per externally addressed neighboring row.

By confining the row hammer errors to a single memory device, the row hammer errors are correctible using a SDDC scheme. In an embodiment, the external row address to internal row address mapping comprises different permutations of the external row address bits for each memory device on the module.

In an embodiment, the functions (i.e., read, write, etc.) of defective rows of a memory array are replaced by redundant rows in the memory array (a.k.a., repair rows). These repair rows are selected such that at least one unutilized (or unused) repair row is disposed between utilized repair rows. The unutilized repair rows are initialized to substantially hold no electrons. The unutilized repair rows may be initialized by placing the memory device in a mode that allows external commands/addresses to write to the unutilized repair rows. Once initialized, the memory device may be placed in an operational mode whereby the unutilized repair rows are not externally addressable.

The descriptions and embodiments disclosed herein are made primarily with references to DRAM devices and DRAM memory arrays. This, however, should be understood to be a first example where, due at least to the widespread adoption of DRAM technology, "row-hammer" has been observed and studied. It should be understood that other memory technologies that may be susceptible to "row-hammer" and therefore may also benefit from the methods and/or apparatus described herein. These memory technologies include, but are not limited to static random access memory (SRAM), non-volatile memory (such as flash), conductive bridging random access memory (CBRAM—a.k.a., programmable metallization cell—PMC), resistive random access memory (a.k.a., RRAM or ReRAM), magnetoresistive random-access memory (MRAM), Spin-Torque Transfer (STT-MRAM), phase change memory (PCM), and the like, and/or combinations thereof. Accordingly, it should be understood that in the disclosures and/or descriptions given herein, these aforementioned technologies may be substituted for, included with, and/or encompassed within, the references to DRAM, DRAM devices, and/or DRAM arrays made herein.

FIG. 1 is a block diagram illustrating a memory system. In FIG. 1, memory system 100 comprises memory device 110 and memory controller 120. Memory device 110 includes command/address (CA) interface 111, data (DQ) interface 112, row mapping 113, memory array 130, row circuitry 131, and column circuitry 132. Row mapping 113 includes configuration information 114. Controller 120 includes CA interface 121, DQ interface 122, and reliability, availability, and serviceability (RAS) circuitry 123 (e.g., error detect and correct—EDC, error correcting code—ECC, chipkill SDDC, memory scrubbing, etc. circuitry).

Controller 120 and memory device 110 may be integrated circuit type devices, such as are commonly referred to as "chips". A memory controller, such as controller 120, manages the flow of data going to and from memory devices and/or memory modules. Memory device 110 may be a standalone device, or may be a component of a memory module such as a DIMM module used in servers. In an embodiment, memory device 110 may be a device that adheres to, or is compatible with, a dynamic random access memory (DRAM) specification. In an embodiment, memory device 110 may be, or comprise, a device that is or includes other memory device technologies and/or specifications. A memory controller can be a separate, standalone chip, or integrated into another chip. For example, a memory controller 120 may be included on a single die with a microprocessor, included as a chip co-packaged with one or more microprocessor chips, included as part of a more complex integrated circuit system such as a block of a system on a chip (SOC), or be remotely coupled to one or more microprocessors via a fabric interconnect or other type of interconnect.

CA interface 121 of controller 120 is operatively coupled to CA interface 111 of memory device 110. CA interface 121 is operatively coupled to CA interface 111 to communicate commands and addresses (e.g., row and column addresses) from controller 120 to memory device 110. In an embodiment, the commands communicated from controller 120 to memory device 110 include activate commands and an associated external row address.

Controller 120 is operatively coupled to memory device 110 via DQ interface 122 and DQ interface 112. Controller 120 and memory device 110 are operatively coupled via DQ interface 122 and DQ interface 112 to bidirectionally communicate data. Memory device 110 may store (e.g., in memory array 130) and retrieve (e.g., from memory array 130) data communicated via DQ interface 122 and DQ interface 112.

CA interface 111 of memory device 110 is operatively coupled to memory array 130. Row addresses received via CA interface 111 (a.k.a., external row addresses) are operatively coupled to memory array 130 via row mapping 113 and row circuitry 131 (e.g., row address decoders, buffers, etc.) Column addresses received via CA interface 111 are operatively coupled to memory array 130 via column circuitry 132 (e.g., column address decoders, buffers, etc.).

In an embodiment, memory device 110 receives external row addresses (e.g., associated with an activate command—ACT) via CA interface 111 and provides the external row addresses to row mapping 113. Based on configuration information 114 (e.g., mode, programmed register value, programmed fuses, etc.), row mapping 113 maps external row addresses to internal row addresses that are provided to row circuitry 131. Row mapping 113 maps external row addresses to internal row addresses so that memory device 110 may be configured to use a mapping that is unique among a group of DRAM devices (not shown in FIG. 1) being accessed by controller 120.

By uniquely configuring the external to internal row address translation of each DRAM in the group, the unique mappings may be selected such that row hammer affects different neighboring row address in each DRAM. Because the external row address to internal row address mappings are selected to ensure that each set of neighboring rows for a given externally addressed row is different for each DRAM in the group, row hammering of a given externally addressed row spreads the row hammering errors across different externally addressed rows on each DRAM. This has the effect of confining the row hammer errors for each row that is hammered to a single DRAM per externally addressed neighboring row. By confining the row hammer errors to a single DRAM, the row hammer errors are correctible by RAS circuitry 123 using, for example, a SDDC scheme.

In an embodiment, the mappings row mapping 113 applies are configurable among a set of row address bit permutations. For example, configuration information 114 may indicate a number of bits to circularly left shift (or circularly right shift) the external row address to generate the internal row address that is provided to row circuitry 131 that selects a row in memory array 130. In an embodiment, row mapping 113 may use a linear feedback shift register (LFSR) selected or seeded by configuration information to permute and/or flip external row address bits in the generation of the internal row address that is provided to row circuitry 131 that selects a row in memory array 130.

Table 1 illustrates an abbreviated example of unique bit shifts per memory device 110 to translate external row addresses to internal row address that result in accesses to a given external row address having different neighboring rows internal to each DRAM device of the group. The external and internal addresses in Table 1 are given in hexadecimal format. In the example of Tables 1, array 130 has 32 rows resulting in 5-bit internal and external row addresses.

TABLE 1

| DRAM Core Row (Internal Row Address) | DRAM#0 External (Controller) Row Address that Maps to DRAM Core Row shown in First Column of this Table Circular left shift of External (Controller) Row Address by 0 bits | DRAM#1 External (Controller) Row Address that Maps to DRAM Core Row shown in First Column of this Table Circular left shift of External (Controller) Row Address by 1 bit | DRAM #2 External (Controller) Row Address that Maps to DRAM Core Row shown in First Column of this Table Circular left shift of External (Controller) Row Address by 2 bits | |
|---|---|---|---|---|
| 00 | 00 | 00 | 00 | . . . |
| 01 | 01 | 10 | 08 | |
| 02 | 02 | 01 | 10 | |
| 03 | 03 | 11 | 18 | |
| 04 | 04 | 02 | 01 | |
| 05 | 05 | 12 | 09 | |
| . . . | . . . | . . . | . . . | |
| 1C | 1C | 0E | 07 | |
| 1D | 1D | 1E | 0F | |
| 1E | 1E | 0F | 17 | |
| 1F | 1F | 1F | 1F | |

Figure 2:
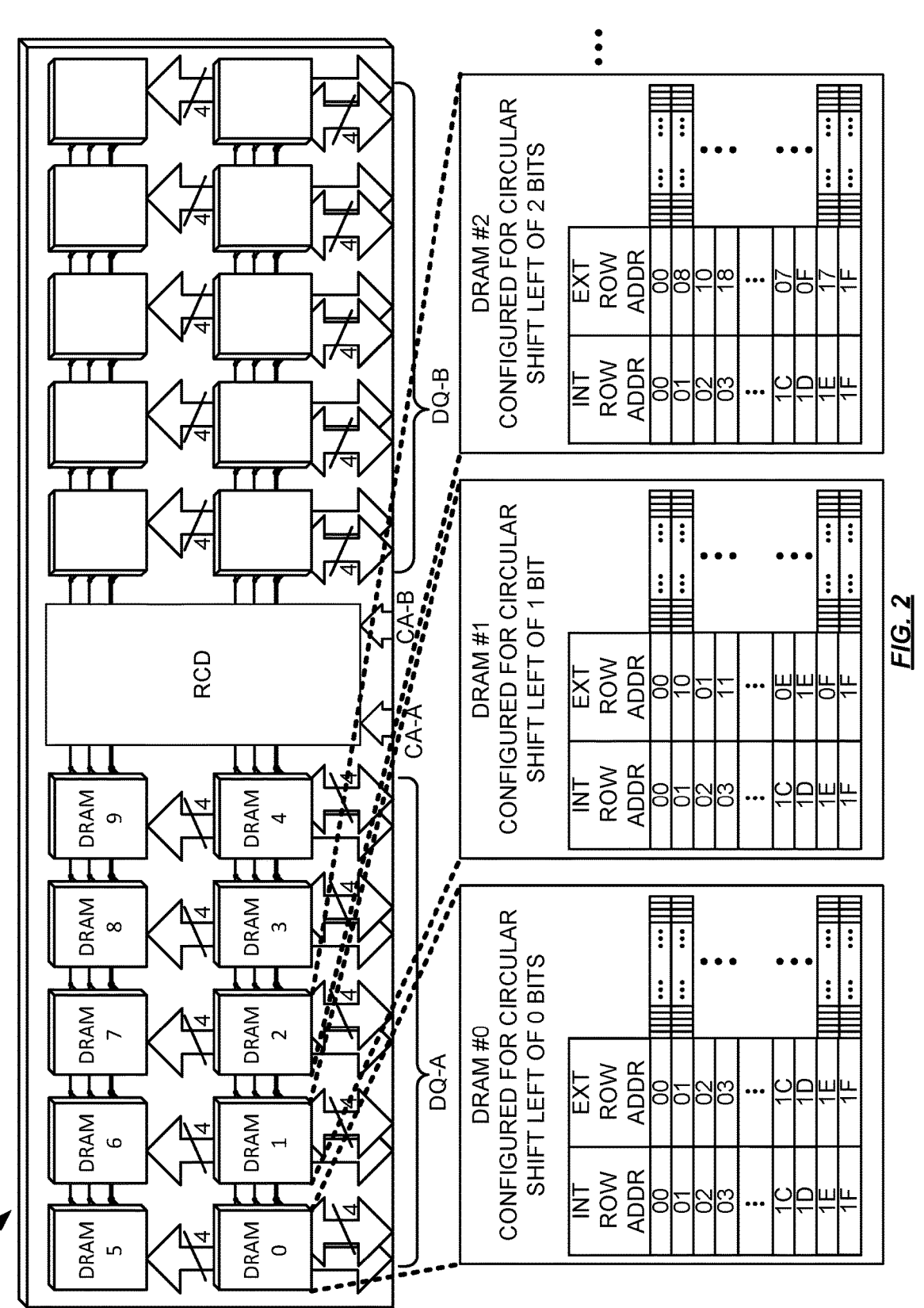
FIG. 2 is an illustration of a configured memory module.

FIG. 2 is an illustration of a configured memory module. It should be apparent from Table 1 and FIG. 2 that, for example an external row address of 0x01 activates internal row 0x01 in DRAM #0, activates internal row 0x02 in DRAM #1, and activates internal row 0x04 in DRAM #3, etc. The internal neighboring rows to internal row 0x01 in DRAM #0 are internal addresses 0x00 and 0x02. The external row addresses that map to these internal rows are 0x00 and 0x02, respectively. The internal neighboring rows to internal row 0x02 in DRAM #1 are internal addresses 0x01 and 0x03. The external row addresses that map to these internal rows are 0x10 and 0x11, respectively. The internal neighboring rows to internal row 0x04 in DRAM #2 are internal addresses 0x03 and 0x05. The external row addresses that map to these internal rows are 0x18 and 0x09, respectively, and so on. Note that the sets of external row addresses that map to internal neighboring rows for DRAMs #0-#2 are entirely non-overlapping sets. Thus, each set of neighboring rows for a given externally addressed row is different for each DRAM in the group. Therefore, row hammering of a given externally addressed row spreads the row hammering errors across different externally addressed rows on each DRAM which has the effect of confining the row hammer errors for each row that is hammered to a single DRAM per externally addressed neighboring row.

The foregoing example illustrates how immediate neighboring rows (e.g. the next physically adjacent rows) are different for each DRAM in the group. It is possible to extend the mapping technique so that multiple immediate neighbor rows (e.g. 2, 3, or more immediately neighboring rows) are different for each DRAM in the group. This will enable a row that is hammered to affect different, non-overlapping sets of 2, 3, or more neighboring rows in each DRAM. By confining errors on any external row address to be confined to a single DRAM, this again allows SDDC error correction to correct any errors that will occur in a single DRAM due to a successful row hammer operation.

Table 2 illustrates an example symbol-codeword bit assignment for ten DRAM devices that are accessed as a group to implement SDDC suitable for correcting row hammering of unique external to internal row mapping among the ten DRAMs (e.g., Channel "A" of module 200.) In Table 2, S1-S7 are data symbols and C0-C1 are codeword symbols. Table 2 assumes a symbol size of 4-bits, and that each DRAM is a ×4 DRAM so that each 4-bit symbol is contained in a different DRAM. Thus, each burst time slot in/out of the module is suitable for implementing a RS(10,8) encoding where when each symbol comes from a single DRAM allows for chipkill capability.

memory module 301 is operatively coupled to CA interfaces 311a-311b of DRAM devices 310a-310b to communicate commands and addresses (e.g., row and column addresses) transmitted by controller 320 to memory module 301. CA interface 351 of memory module 301 is operatively coupled to CA interfaces 311a-311b of DRAM devices 310a-310b to communicate the same commands and addresses to each of CA interfaces 311a-311b. In an embodiment, the commands communicated from controller 320 to memory module 301 (and therefore DRAM devices 310a-310b) include activate commands and associated external row addresses.

Controller 320 is operatively coupled to memory module 301 via DQ interfaces 352a-352b. Controller 320 is operatively coupled to memory module 301 via DQ interfaces 352a-352b to bidirectionally communicate data. DRAM devices 310a-310b may store (e.g., in memory arrays 330a-330b) and retrieve (e.g., from memory arrays 330a-330b) data communicated via DQ interfaces 352a-352b. DQ interface 352a is operatively coupled to DQ interface 312a of DRAM device 310a. DQ interface 352a is operatively coupled to DQ interface 312a of DRAM device 310a. Controller 320 may communicate entire and separate sym-

TABLE 2

| Burst slot | DRAM #0 in/out | DRAM #1 in/out | DRAM #2 in/out | DRAM #3 in/out | DRAM #4 in/out | DRAM #5 in/out | DRAM #6 in/out | DRAM #7 in/out | DRAM #8 in/out | DRAM #9 in/out |
|---|---|---|---|---|---|---|---|---|---|---|
| 0 | S0 | S1 | S2 | S3 | S4 | S5 | S6 | S7 | C0 | C1 |
| 1 | S0 | S1 | S2 | S3 | S4 | S5 | S6 | S7 | C0 | C1 |
| 2 | S0 | S1 | S2 | S3 | S4 | S5 | S6 | S7 | C0 | C1 |
| . . . | . . . | . . . | . . . | . . . | . . . | . . . | . . . | . . . | . . . | . . . |
| 14 | S0 | S1 | S2 | S3 | S4 | S5 | S6 | S7 | C0 | C1 |
| 15 | S0 | SI | S2 | S3 | S4 | S5 | S6 | S7 | C0 | C1 |

It should be understood from Table 2 that if errors are confined to a single DRAM device (e.g., failed device or unique row mappings to ensure unique neighboring rows), the errors are output from only one DRAM device which can be corrected by a chipkill encoding, or SDDC encoding.

Figure 3:
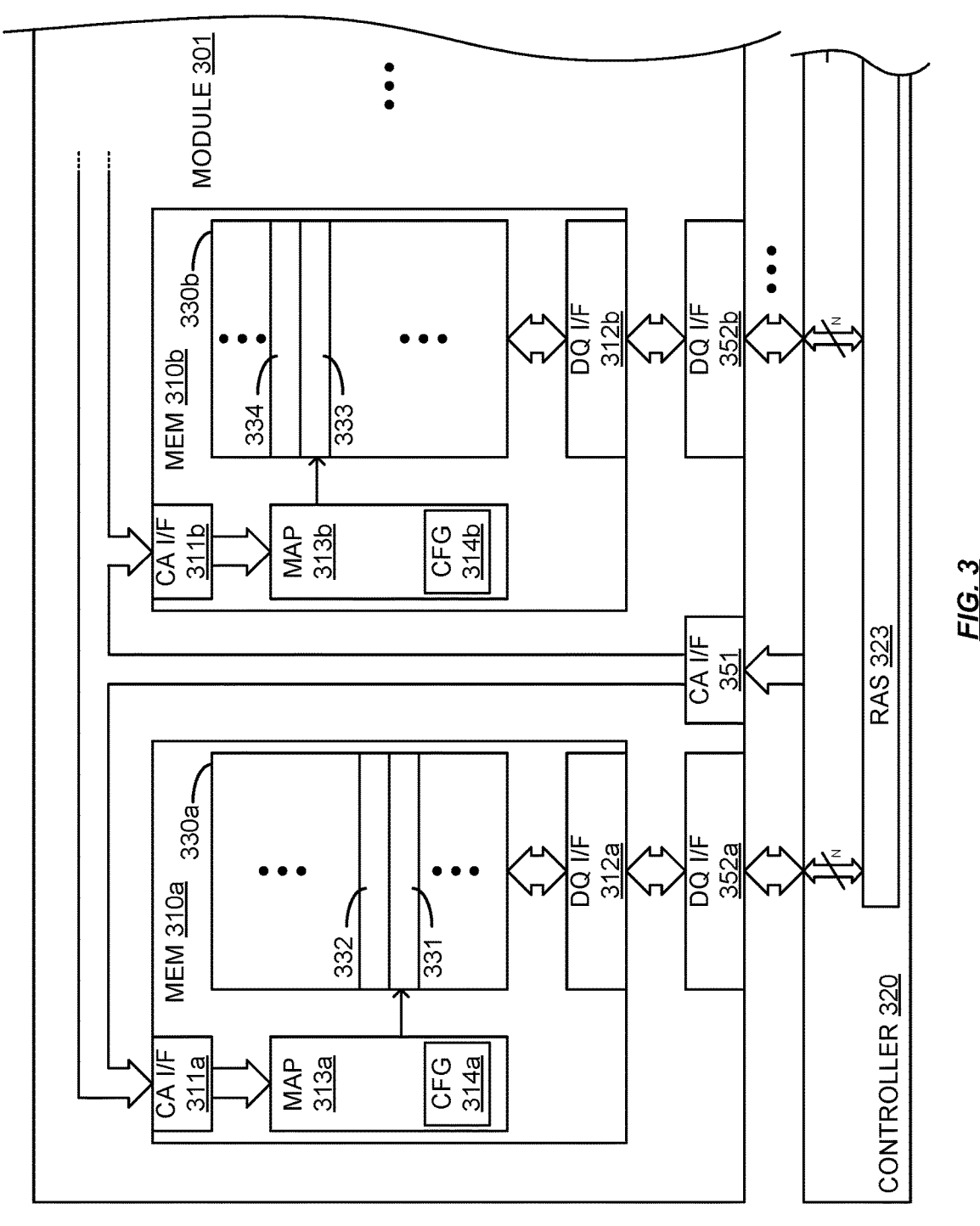
FIG. 3 is a block diagram illustrating a memory module system.

FIG. 3 is a block diagram illustrating a memory module system. In FIG. 3, memory system 300 comprises memory module 301 and memory controller 320. Memory module 301 comprises DRAM devices 310a-310b and other memory devices not shown in FIG. 3. Memory module 301 also includes command/address (CA) interface 351, and data (DQ) interfaces 352a-352b.

DRAM devices 310a-310b respectively include CA interfaces 311a-311b, DQ interfaces 312a-312b, row mappings 313a-313b, and memory arrays 330a-330b. Row address mappers 313a-313b respectively include configuration information 314a-314b. Controller 320 includes reliability, availability, and serviceability (RAS) circuitry 323 (e.g., error detect and correct—EDC, error correcting code—ECC, chipkill SDDC, memory scrubbing, etc. circuitry).

CA interfaces 311a-311b, respectively, of DRAM devices 310a-310b are operatively coupled to memory arrays 330a-330b, respectively. Row addresses received via CA interfaces 311a-311b, respectively, are operatively coupled to memory arrays 330a-330b, respectively, via row mapping 313a-313b, respectively. DQ interfaces 352a-352b, respectively, are operatively coupled to memory arrays 330a-330b, respectively.

Controller 320 is operatively coupled to CA interface 351 of memory module 301. CA interface 351 of memory module 301 is operatively coupled to CA interfaces 311a-311b of DRAM devices 310a-310b. CA interface 351 of bols or codewords via each of DQ interfaces 352a-352b thereby respectively communicating entire and separate symbols or codewords with DRAM devices 310a-310b.

In an embodiment, controller 320 transmits external row addresses (e.g., associated with an activate command—ACT) to memory module 301. DRAM devices 310a-310b receive these external row addresses via CA interfaces 311a-311b. DRAM device 310a provides the external row addresses to row mapping 313a. DRAM device 310b provides the external row addresses to row mapping 313b.

Based on configuration information 314a (e.g., mode, programmed register value, programmed fuses, etc.), row mapping 313a maps the received external row addresses to internal row addresses that are provided to memory array 330a. The mapped internal row address is used as an index to access (e.g., activate) a row in memory array 330a. This is illustrated in FIG. 3 by the arrow from row mapping 313a to row 331 in memory array 330a. Accessed row 331 in array 330a has at least one neighbor row 332.

Based on configuration information 314b (e.g., mode, programmed register value, programmed fuses, etc.), row mapping 313b maps the received external row addresses to internal row addresses that are provided to memory array 330b. The mapped internal row address is used as an index to access (e.g., activate) a row in memory array 330b. This is illustrated in FIG. 3 by the arrow from row mapping 313b to row 333 in memory array 330b. Accessed row 333 in array 330b has at least one neighbor row 334.

In an embodiment, configuration information 314a-314b (e.g., as set by controller 320) configures each of the row mappings 313a-313b of the DRAM devices 310a-310b on memory module 301 to each be unique among the DRAM devices 310*a*-310*b* on memory module 301. By uniquely configuring the external to internal row address translation of each DRAM device 310*a*-310*b* accessed as a group (i.e., concurrently receiving the same commands/addresses from CA interface 351) on memory module 301, the unique mappings may be selected such that row hammer affects different neighboring row addresses in each DRAM device 310*a*-310*b*. The external row address to internal row address mappings set by configuration information 314*a*-314*b* are selected to ensure that each set of neighboring rows for a given externally addressed row is different for each DRAM device 310*a*-310*b* accessed as a group on memory module 301. This is illustrated in FIG. 3 by neighboring row 332 and neighbor row 334 being located in different positions of memory arrays 330*a*-330*b*, respectively. Similarly, the different mappings set by configuration information 314*a*-314*b* is illustrated in FIG. 3 by internally addressed row 331 and internally addressed row 333 being located in different positions of memory arrays 330*a*-330*b*, respectively.

Having different internal neighboring rows for a single external address on a per DRAM device 310*a*-310*b* basis spreads the row hammering errors across different externally addressed rows on each DRAM device 310*a*-310*b*. This has the effect of confining the row hammer errors for each row that is hammered to a single DRAM device 310*a*-310*b* per externally addressed neighboring row. By confining the row hammer errors to a single DRAM device 310*a*-310*b*, the row hammer errors are correctible by RAS circuitry 323 using, for example, a SDDC scheme.

In an embodiment, the mappings row mapping 313*a*-313*b* apply are configurable among a set of row address bit permutations. For example, configuration information 314*a* may indicate a first number of bits (e.g., 1) to circularly left shift (or circularly right shift) the external row address to generate the internal row address that selects a row 331 in memory array 330*a*. Configuration information 314*b* may indicate a second number of bits that is different from the first number of bits (e.g., 3) to circularly left shift (or circularly right shift) the external row address to generate the internal row address that selects a row 333 in memory array 330*b*. Each of these number of circular left shifts (or circular right shifts) may be configured to be unique among DRAM device 310*a*-310*b* accessed as a group on memory module 301. Table 1 illustrates an example configuration to provide unique, among DRAM devices 310*a*-310*b* that are accessed as a group on memory module 301, permutations that ensure row hammer errors are confined to a single DRAM device 310*a*-310*b* per externally addressed row that is hammered.

In an embodiment, row mapping 313 may use a linear feedback shift register (LFSR) selected or seeded by unique, among DRAM devices 310*a*-310*b* that are accessed as a group on memory module 301, configuration information 314*a*-314*b* to permute and/or flip external row address bits in the generation of the internal row address that is provided to respective memory arrays 330*a*-330*b*. Table 2 illustrates an example symbol-codeword bit assignment for a ten DRAM device 310*a*-310*b* memory module 301 to implement SDDC suitable for correcting row hammering of unique external to internal row mappings among the DRAM devices 310*a*-310*b* accessed as a group on memory module 301.

FIG. 4 is a flowchart illustrating a method of operating a memory module. One or more of the steps illustrated in FIG. 4 may be performed by, for example, memory system 100, module 200, memory system 300, memory system 1000, and/or their components. Via a command/address interface of a memory module, a first row address is received (402). For example, memory module 301 may receive, via CA interface 351, a row address associated with an activate command.

By a first DRAM device on the memory module that includes a first memory array, the first address is received (404). For example, DRAM device 310*a*, which includes memory array 330*a*, may receive, via CA interface 311*a*, the row address associated with the activate command. Based on the first row address, a first row in the first memory array that has a first internal address is accessed where the first row is physically next to a first neighboring row having a first internal neighboring row address (406). For example, based on the row address associated with the activate command, DRAM device 310*a* may activate, after mapping of the external address by row mapping 313*a*, row 331 where row 331 is physically next to neighboring row 332.

By a second DRAM device on the memory module that includes a second memory array, the first address is received (408). For example, DRAM device 310*b*, which includes memory array 330*b*, may receive, via CA interface 311*b*, the row address associated with the activate command. Based on the first row address, a second row in the second memory array that has a second internal address is accessed where the second row is physically next to a second neighboring row having a second internal neighboring row address and a first external address that maps to the first internal neighboring row address and a second external address that maps to the second internal neighboring row address are not equal (410). For example, based on the row address associated with the activate command, DRAM device 310*b* may activate, after mapping of the external address by row mapping 313*b*, row 333 where row 333 is physically next to neighbor row 334 and the external address that maps to internal neighbor row 332 is not the same as the external address that maps to internal neighbor row 334.

FIG. 5 is a flowchart illustrating a method of accessing a memory module. One or more of the steps illustrated in FIG. 5 may be performed by, for example, memory system 100, module 200, memory system 300, memory system 1000, and/or their components. A first DRAM device on a module is configured to use a first mapping of external row addresses to internal row address (502). For example, controller 320 may set configuration information 314*a* to configure row mapping 313*a* to use a first mapping (e.g., 3 bit right shift) of external row addresses received via CA interface 311*a* to internal row addresses that select rows in memory array 330*a*.

A second DRAM device on a module is configured to use a second mapping of external row addresses to internal row address (504). For example, controller 320 may set configuration information 314*b* to configure row mapping 313*b* to use a second mapping (e.g., 5 bit right shift) of external row addresses received via CA interface 311*b* to internal row addresses that select rows in memory array 330*b* where the first mapping used by DRAM device 310*a* is different from and the second mapping used by DRAM device 310*b*. A first row address is provided to the first DRAM device and the second DRAM device (506). For example, controller 320 may transmit, via CA interface 351, a row address associated with an activate command that is provided to the CA interfaces 311*a*-311*b* of DRAM devices 310*a*-310*b* that are accessed as a group.

Data is communicated with a first internal row at a first internal row address of the first DRAM device (508). For example, controller 320 may provide an external addresses that accesses row 331 in DRAM device 310*a* to read and/or write data from/to row 331. Data is communicated with a second internal row at a second internal row address of the second DRAM device where a first external row address that maps to a first internal row address neighbor and a second external row address that maps to a second internal row address neighbor are not the same (510). For example, controller 320 may provide the same external addresses that accesses row 331 in DRAM device 310a to DRAM device 310b to read and/or write data from/to row 333 where the external row address that maps to the internal address of neighbor row 332 is not the same as the external row address that maps to the internal address of neighbor row 334.

FIG. 6 is a flowchart illustrating a method of accessing different internal rows of different dynamic random access memory (DRAM) devices on a module. One or more of the steps illustrated in FIG. 6 may be performed by, for example, memory system 100, module 200, memory system 300, memory system 1000, and/or their components. A first DRAM device on a module is configured to use a first cyclic shift of external row addresses to generate internal row addresses (602). For example, controller 320 may configure DRAM device 310a on memory module 301 by setting configuration information 314a to configure row mapping 313a to implement a cyclic right shift of a first number of bits (e.g., 5 bits) to generate internal row addresses that index to rows in memory array 330a.

A second DRAM device on a module is configured to use a second cyclic shift of external row addresses to generate internal row addresses (604). For example, controller 320 may configure DRAM device 310b on memory module 301 by setting configuration information 314b to configure row mapping 313b to implement a cyclic right shift of a second number of bits (e.g., 6 bits) to generate internal row addresses that index to rows in memory array 330b. A first row address is provided to the first DRAM device where the first row address is mapped to a first internal row address by the first DRAM device and concurrently provide the second DRAM device with the first row address where the first row address is mapped to a second internal row address by the second DRAM device (606). For example, controller 320 may transmit a row address associated with an activate command to memory module 301 which, in turn, provides that row address to DRAM device 310a and DRAM device 310b.

Data is communicated with a first internal row at a first internal row address of the first DRAM device and data is communicated with a second internal row at a second internal row address of the second DRAM device where a first external row address that maps to a first neighbor row of the first internal row address and a second external row address that maps to a second neighbor row of the second internal row address are not the same (608). For example, controller 320 may provide an external address to memory module 301 that accesses row 331 in DRAM device 310a to read and/or write data from/to row 331 and provide the same external addresses that accesses row 331 in DRAM device 310a to DRAM device 310b to read and/or write data from/to row 333, where the external address that maps to neighbor row 332 is not the same as the external address that maps to neighbor row 334.

Figure 7:
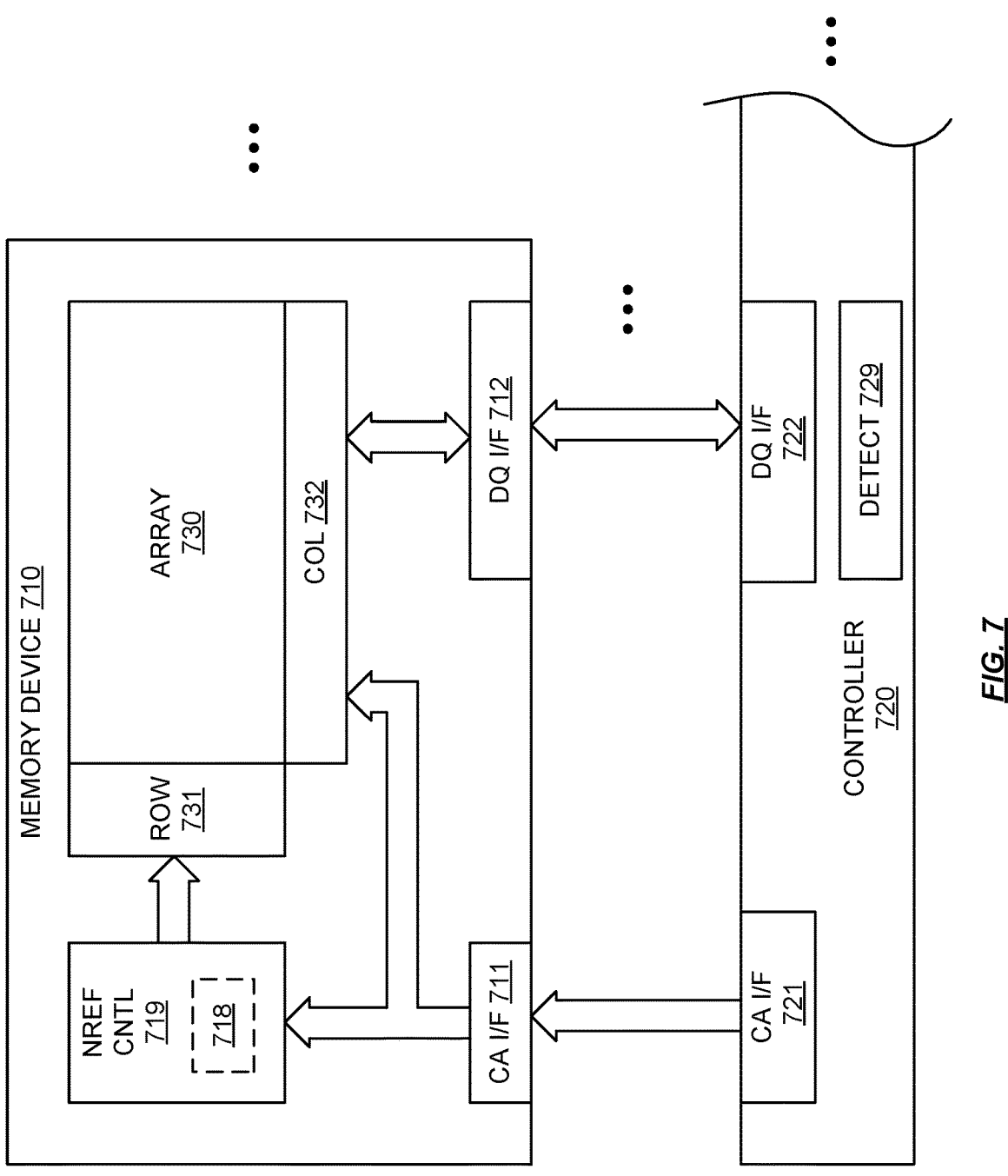
FIG. 7 is a block diagram illustrating a memory system.

FIG. 7 is a block diagram illustrating a memory system. In FIG. 7, memory system 700 comprises memory device 710 and memory controller 720. Memory device 710 includes command/address (CA) interface 711, data (DQ) interface 712, neighbor refresh control 719, memory array 730, row circuitry 731, and column circuitry 732. Neighbor refresh control 719 optionally includes configuration information 718. Controller 720 includes CA interface 721, DQ interface 722, and row hammer detection circuitry 729.

CA interface 721 of controller 720 is operatively coupled to CA interface 711 of memory device 710. CA interface 721 is operatively coupled to CA interface 711 to communicate commands and addresses (e.g., row and column addresses) from controller 720 to memory device 710. In an embodiment, the commands communicated from controller 720 to memory device 710 include activate commands and an associated external row address.

Controller 720 is operatively coupled to memory device 710 via DQ interface 722 and DQ interface 712. Controller 720 and memory device 710 are operatively coupled via DQ interface 722 and DQ interface 712 to bidirectionally communicate data. Memory device 710 may store (e.g., in memory array 730) and retrieve (e.g., from memory array 730) data communicated via DQ interface 722 and DQ interface 712.

CA interface 711 of memory device 710 is operatively coupled to memory array 730. Row addresses received via CA interface 711 (a.k.a., external row addresses) are operatively coupled to memory array 730 via row circuitry 731 (e.g., row address decoders, buffers, etc.) Column addresses received via CA interface 711 are operatively coupled to memory array 730 via column circuitry 732 (e.g., column address decoders, buffers, etc.).

In an embodiment, controller 720 may transmit to memory device 710 a neighbor refresh command (NREF) via CA interface 721 and CA interface 711, respectively. The NREF command includes or is associated with an address of a row that row hammer detection circuitry 729 has identified is being subject to row hammer conditions. In response to the NREF command, neighbor refresh control 719 refreshes one or more neighbor rows to the address associated with the NREF command. In an embodiment, memory device 710 includes configuration information 718 that indicates the number of neighboring rows to be refreshed (e.g., 1, 2, 3, 4, etc. rows). In an embodiment, configuration information 718 may be set in a register by controller 720. In another embodiment, serial presence detect (SPD) circuitry on a module may include configuration information 718 to be set in a register in memory device 710. In another embodiment, the NREF command may include configuration information 718 that indicates the number of neighboring rows to be refreshed.

In an embodiment, the neighboring rows to be refreshed may be subject to external to internal address mapping as discussed herein with reference to FIGS. 1-6. In this case, NREF control may include circuitry to determine, based on address mapping configuration information 718, which rows are neighboring rows, or are in the neighborhood of (i.e., within 1, 2, 3 etc. rows—as specified), to the row address associated with the NREF command. In other words, to refresh the specified number of neighboring rows, neighbor refresh control 719 may determine an inverse mapping of the external row address to internal row address mapping performed by, for example, row mapping 113.

FIG. 8 is a flowchart illustrating a method of mitigating row hammer. One or more of the steps illustrated in FIG. 8 may be performed by, for example, memory system 100, module 200, memory system 300, memory system 700, memory system 1000, and/or their components. A row hammer condition on a first row address is detected (802). For example, row hammer detection circuitry 729 in controller 720 may detect that a first row address is being repeatedly activated within a certain amount of time (e.g., greater than N number of activations of the same row in less than a refresh cycle period).

In response to detecting the row hammer condition, a neighbor refresh command is transmitted to refresh the rows in the neighborhood of the first row address (804). For example, in response to detecting the first row address is being repeatedly activated within a certain amount of time, controller 720 may transmit a neighbor refresh command to memory device 710 so that neighbor refresh control 719 will refresh the rows with a specified number of rows (e.g., 1, 2, 3, etc.) physically next to the row indicated by the neighbor refresh command.

Figure 9:
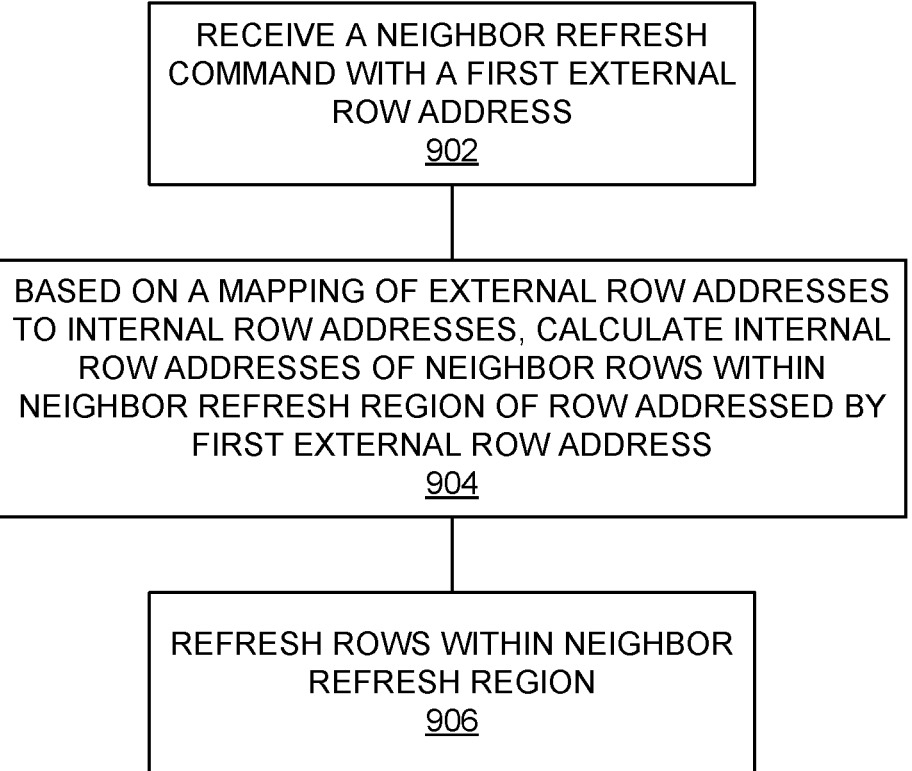
FIG. 9 is a flowchart illustrating a method of refreshing neighboring rows.

FIG. 9 is a flowchart illustrating a method of refreshing neighboring rows. One or more of the steps illustrated in FIG. 9 may be performed by, for example, memory system 100, module 200, memory system 300, memory system 700, memory system 1000, and/or their components. A neighbor refresh command with a first external row address is received (902). For example, memory device 710 may receive a neighbor refresh command from controller 720 after row hammer detection circuitry 729 detect a row hammer condition associated with a first external address.

Based on a mapping of external row addresses to internal row addresses, calculate internal row addresses of neighbor rows within a neighbor refresh region of the row addressed by first external row address (904). For example, neighbor refresh control 719 of memory device 710 may, in response to a neighbor refresh command, determine, based on address mapping configuration information 718, the addresses of rows that are neighboring rows, or are within a specified number of rows, to the row address associated with the neighbor refresh command. The rows within the neighbor refresh region are refreshed (906). For example, neighbor refresh control 719 of memory device 710 may refresh the rows that are neighboring rows of, or are within a specified number of rows of, the row address associated with the neighbor refresh command.

Figure 10A:
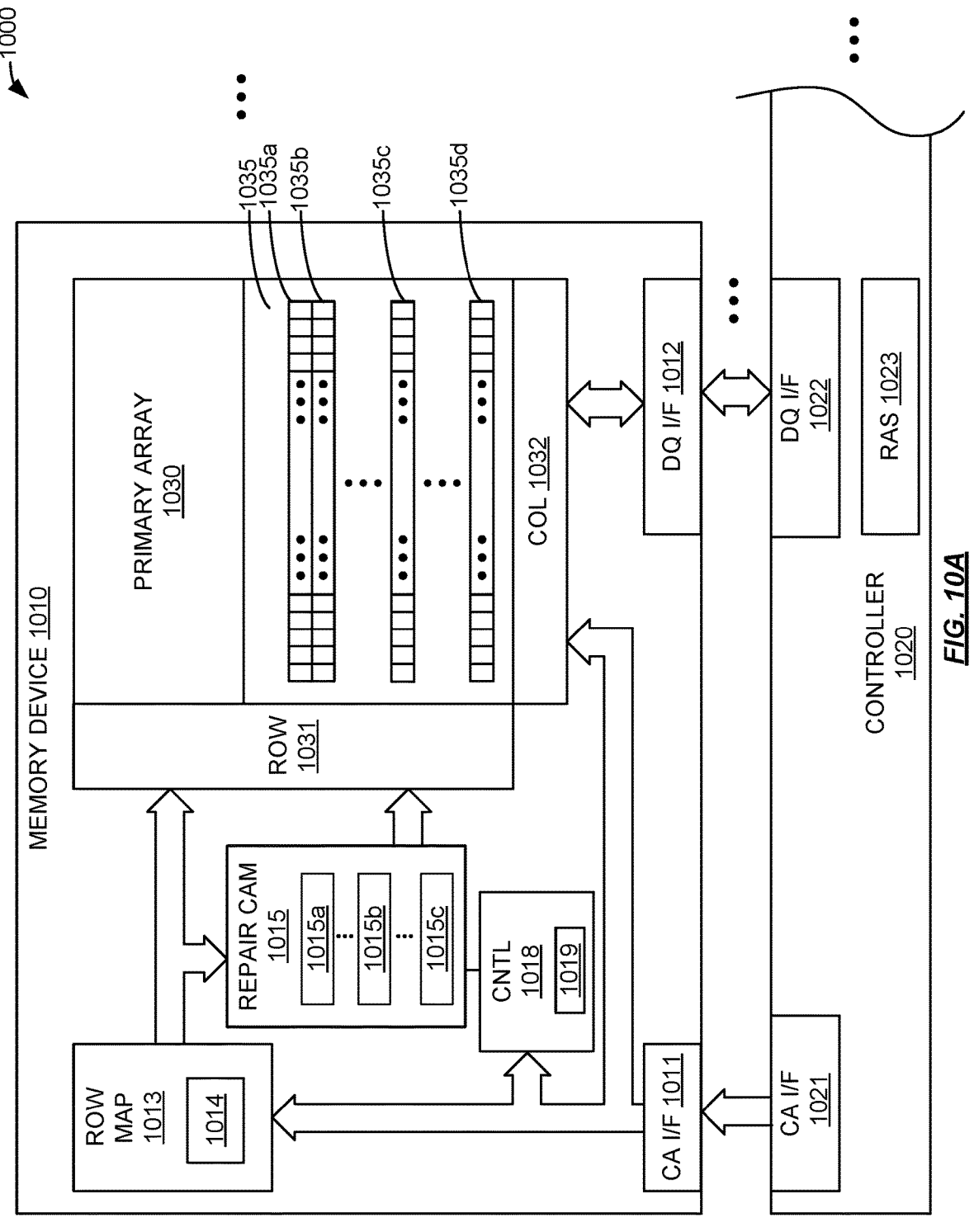
FIG. 10A-10C are diagrams illustrating repair row shielding.
Figure 10B:
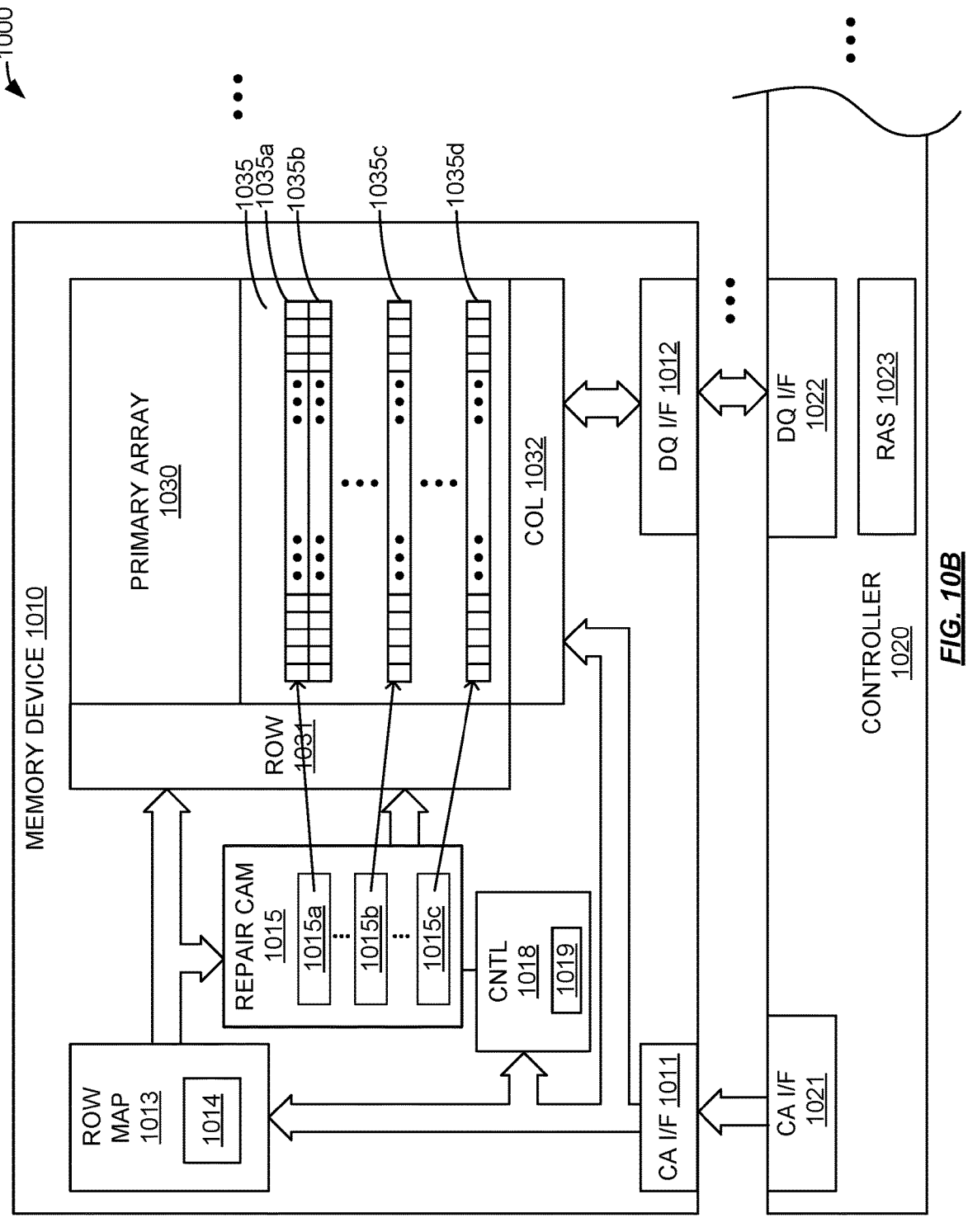
Figure 10C:
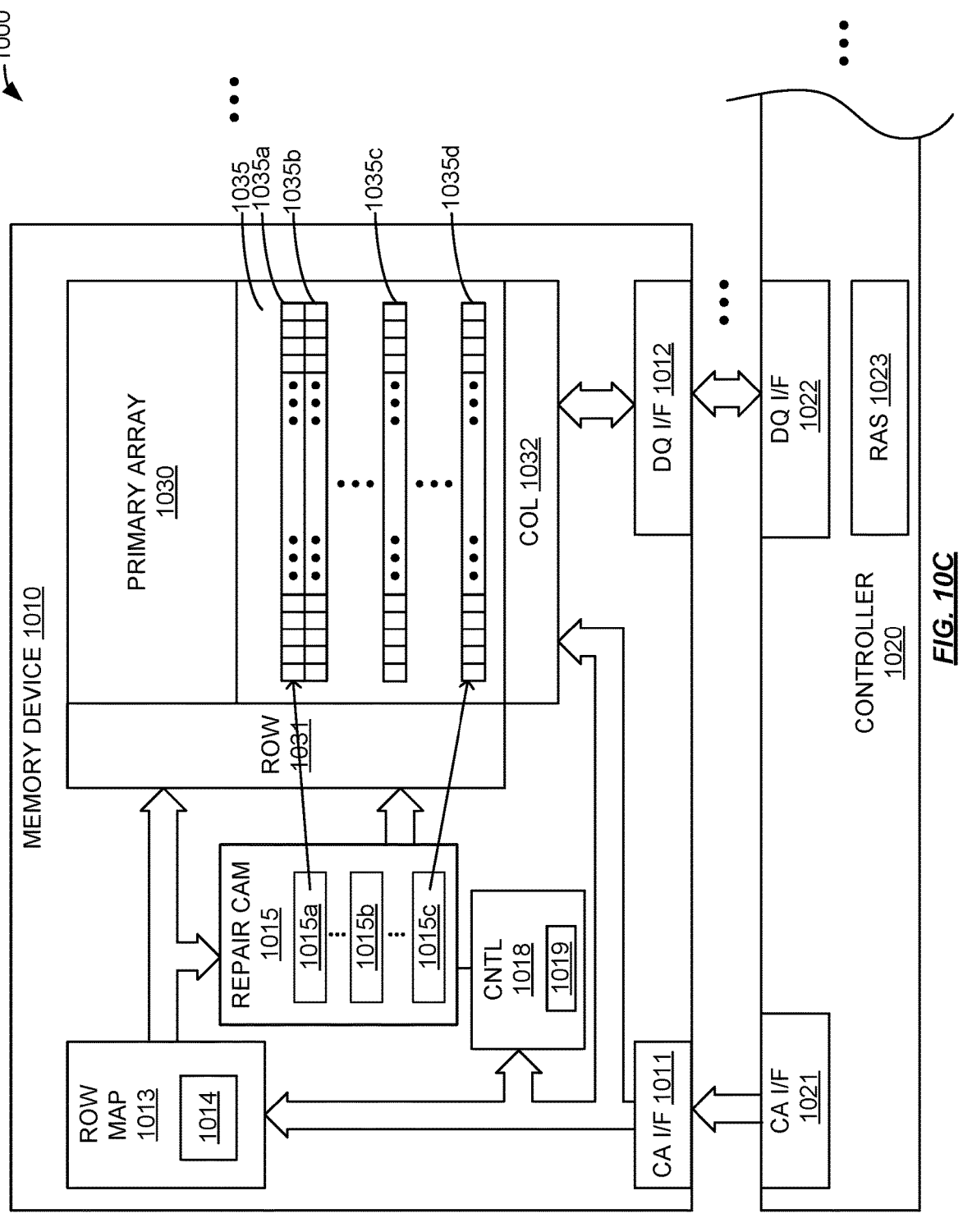

FIG. 10A-10C are diagrams illustrating repair row shielding. In FIGS. 10A-10C, memory system 1000 comprises memory device 1010 and memory controller 1020. Memory device 1010 includes command/address (CA) interface 1011, data (DQ) interface 1012, row mapping 1013, primary memory array 1030, repair rows 1035, row circuitry 1031, column circuitry 1032, repair content addressable memory (CAM) 1015, and control circuitry 1018. Row mapping 1013 includes configuration information 1014. Control circuitry 1018 includes mode circuitry 1019. Repair CAM 1015 includes repair row mappings 1015a-1015c. Repair rows 1035 includes repair rows 1035a-1035d. Controller 1020 includes CA interface 1021, DQ interface 1022, and reliability, availability, and serviceability (RAS) circuitry 1023 (e.g., error detect and correct—EDC, error correcting code—ECC, chipkill SDDC, memory scrubbing, etc. circuitry).

Controller 1020 and memory device 1010 may be integrated circuit type devices, such as are commonly referred to as "chips". A memory controller, such as controller 1020, manages the flow of data going to and from memory devices and/or memory modules. Memory device 1010 may be a standalone device, or may be a component of a memory module such as a DIMM module used in servers. In an embodiment, memory device 1010 may be a device that adheres to, or is compatible with, a dynamic random access memory (DRAM) specification. In an embodiment, memory device 1010 may be, or comprise, a device that is or includes other memory device technologies and/or specifications. A memory controller can be a separate, standalone chip, or integrated into another chip. For example, a memory controller 1020 may be included on a single die with a microprocessor, included as a chip co-packaged with one or more microprocessor chips, included as part of a more complex integrated circuit system such as a block of a system on a chip (SOC), or be remotely coupled to one or more microprocessors via a fabric interconnect or other type of interconnect.

CA interface 1021 of controller 1020 is operatively coupled to CA interface 1011 of memory device 1010. CA interface 1021 is operatively coupled to CA interface 1011 to communicate commands and addresses (e.g., row and column addresses) from controller 1020 to memory device 1010. In an embodiment, the commands communicated from controller 1020 to memory device 1010 include activate commands and an associated external row address. In an embodiment, when in an operational mode, the external row addresses received from controller 1020 are selected from a contiguous range of external row addresses (i.e., contiguous address range).

Controller 1020 is operatively coupled to memory device 1010 via DQ interface 1022 and DQ interface 1012. Controller 1020 and memory device 1010 are operatively coupled via DQ interface 1022 and DQ interface 1012 to bidirectionally communicate data. Memory device 1010 may store (e.g., in primary memory array 1030 and repair rows 1035) and retrieve (e.g., from primary memory array 1030 and repair rows 1035) data communicated via DQ interface 1022 and DQ interface 1012.

CA interface 1011 of memory device 1010 is operatively coupled to memory array 1030. Some row addresses received via CA interface 1011 (a.k.a., external row addresses) are operatively coupled to primary memory array 1030 via row mapping 1013 and row circuitry 1031 (e.g., row address decoders, buffers, etc.) Row addresses corresponding to rows whose functionality has been replaced by rows in repair rows 1035 (e.g., external row addresses having an entry 1015a-1015c in repair CAM 1015) are operatively coupled to repair rows 1035 via repair CAM 1015 and row circuitry 1031. Column addresses received via CA interface 1011 are operatively coupled to primary memory array 1030 and repair rows 1035 via column circuitry 1032 (e.g., column address decoders, buffers, etc.).

In an embodiment, memory device 1010 receives external row addresses (e.g., associated with an activate command— ACT) via CA interface 1011 and provides the external row addresses to row mapping 1013. Based on configuration information 1014 (e.g., mode, programmed register value, programmed fuses, etc.), row mapping 1013 maps external row addresses to internal primary memory array 1030 row addresses that are provided to row circuitry 1031 and repair CAM 1015. Row mapping 1013 maps external row addresses to internal primary memory array 1030 row addresses so that memory device 1010 may be configured to use a mapping that is unique among a group of DRAM devices (not shown in FIGS. 10A-10C) being accessed by controller 1020.

By uniquely configuring the external to primary memory array 1030 internal row address translation of each DRAM in the group, the unique mappings may be selected such that row hammer affects different neighboring primary memory array 1030 row addresses in each DRAM. Because the external row address to primary memory array 1030 internal row address mappings are selected to ensure that each set of neighboring rows in primary memory array 1030 for a given externally addressed row is different for each DRAM in the group, row hammering of a given externally addressed row spreads the row hammering errors across different externally addressed rows on each DRAM. This has the effect of confining the row hammer errors for each row that is hammered in primary memory array 1030 to a single DRAM per externally addressed neighboring row. By confining the row hammer errors in primary memory array 1030 to a single DRAM, the row hammer errors are correctible by RAS circuitry 1023 using, for example, a SDDC scheme.

In an embodiment, the mappings row mapping 1013 applies are configurable among a set of row address bit permutations. For example, configuration information 1014 may indicate a number of bits to circularly left shift (or circularly right shift) the external row address to generate the internal primary memory array 1030 row address that is provided to row circuitry 1031 and repair CAM 1015. In an embodiment, row mapping 1013 may use a linear feedback shift register (LFSR) selected or seeded by configuration information to permute and/or flip external row address bits in the generation of the internal primary memory array 1030 row address that is provided to row circuitry 1031 and repair CAM 1015.

Table 1 illustrates an abbreviated example of unique bit shifts per memory device 1010 to translate external row addresses to internal primary memory array 1030 row addresses that result in accesses to a given external row address in primary memory array 1030 having different neighboring rows internal to each DRAM device of the group.

In an embodiment, the functionality (e.g., storing data) of some rows in primary array 1030 may be replaced by corresponding repair rows 1035. Thus, not all of the rows in primary array 1030 may be utilized. Likewise, depending upon how many rows in primary memory array 1030 are replaced by rows in repair rows 1035, some of the rows in repair rows 1035 may be utilized and some rows in repair rows 1035 may be unutilized. In an embodiment, when in an operational mode, the unutilized repair rows of memory device 1010 are not accessible using external addresses received via CA interface 1011.

The internal primary memory array 1030 addresses are provided to repair CAM 1015. If there is not an entry 1015a-1015c in repair CAM 1015 for the address provided, the internal primary memory array 1030 address is used by row circuitry 1031 for the access. In other words, the access is directed to a utilized row of primary memory array 1030. If there is an entry 1015a-1015c in CAM 1015 for the external row address provided, CAM 1015 provides an internal repair row address (and/or indicator) to row circuitry 1031. Based at least in part on the internal repair row address received, row circuitry 1031 accesses a repair row 1035 rather than a row in primary memory array 1030. In other words, the access is directed to a utilized row of repair rows 1035.

In an embodiment, the repair entries in repair CAM 1015 are configured such that at least one unutilized repair row in repair rows 1035 is physically intervening between utilized repair rows in repair rows 1035. This is illustrated in FIG. 10B by repair CAM entry 1015a pointing (shown by arrow) to utilized repair row 1035a, repair CAM entry 1015b pointing (shown by arrow) to utilized repair row 1035c, where unutilized repair row 1035b (shown by lack of an arrow from repair CAM 1015) is physically between utilized repair row 1035a and utilized repair row 1035c.

In an embodiment, the repair entries in repair CAM 1015 are configured such that more than one unutilized repair row in repair rows 1035 is between utilized repair rows in repair rows 1035. This is illustrated in FIG. 10C by repair CAM entry 1015a pointing (shown by arrow) to utilized repair row 1035a, repair CAM entry 1015c pointing (shown by arrow) to utilized repair row 1035d, where unutilized repair row 1035b and unutilized repair row 1035c (shown by a lack arrows from repair CAM 1015) are physically between utilized repair row 1035a and utilized repair row 1035d.

It should be understood from FIG. 10A-10C that memory device 1010 is configured to place unutilized repair rows (e.g., repair row 1035b in FIG. 10B) between utilized repair rows (e.g., repair row 1035a and repair row 1035c in FIG. 10B). Thus, if a utilized repair row is hammered, the neighboring row is not being utilized. By not being utilized, row hammer errors that may develop in the unutilized (and therefore not accessible during normal operation) neighboring row do not propagate outside of memory device 1010 (i.e., to controller 1020 via DQ interface 1012).

In an embodiment, control circuitry 1018 may write to the unutilized repair rows in repair rows 1035. For example, under the control of controller 1020 (e.g., during an initialization sequence), control circuitry 1018 may write values to the unutilized repair rows that results in the storage capacitors in the unutilized repair rows substantially holding no electrons. In an embodiment, controller 1020 may place memory device 1010 in a mode (e.g., value in mode circuitry 1019) that allows unutilized repair rows in repair rows 1035 to be addressed (i.e., accessible) using addresses provided to CA interface 1011. In another embodiment, controller 1020 may initialize both the utilized and unutilized repair rows 1035 to values that result in the storage capacitors in all of the repair rows 1035 substantially holding no electrons.

In an embodiment, controller 1020 "scambles" the data written to memory device 1010. It should be understood that "scrambled" means that there is a function that maps a data pattern to another data pattern. Thus, for example, a data pattern like "0000" might turn into "0101". Thus, in an embodiment, the process of controller 1020 writing values to memory device 1010 so that the unutilized repair rows substantially holding no electrons may include controller 1020 to suspending the scrambling (and/or take it into account and reverse the scrambling) so that the values that are written to the unutilized repair rows result in the storage capacitors substantially holding no electrons.

In an embodiment, memory device 1010 may be used to store ECC information (e.g., generated by RAS 1023). In this case, the ECC syndrome that is calculated may not be the data pattern that is desired to be stored in the unutilized shielding rows (i.e., that results result in the storage capacitors substantially holding no electrons). In an embodiment, RAS 1023 may be disabled or overridden (e.g., through the use of a special mode) so that ECC syndrome generation is bypassed, and data that gets written to memory device corresponds to the no charge in the bit cells state.

In an embodiment, controller 1020 may configure memory device 1010 into a first mode. For example, controller 1020 may configure memory device 1010 into an initialization mode where external row addresses received via CA interface may be used to write values to unutilized repair rows of repair rows 1035. Controller 1020 may also configure memory device into a second mode. For example, controller 1020 may configure memory device 1010 into an operational mode where external row addresses received via CA interface cannot be used to access the unutilized repair rows of repair rows 1035. Also while in the operational mode, and based on configuration information 1014, memory device 1010 may translate external row addresses to corresponding internal row addresses to access the utilized primary rows and the utilized repair rows. Controller 1020 may use mode setting commands transmitted via CA interface 1021 and received via CA interface 1011 to configure memory device 1010 into the first mode and the second mode.

In an embodiment, the manufacturer of memory device 1010 selects a first repair row (e.g., repair row 1035a) to perform the functions of a first primary row. The manufacturer may configure memory device 1010 (e.g., by configuring repair CAM 1015) to access the first repair row in response to addresses directed to the first primary row. The manufacturer may also select a second repair row to perform the functions of a second primary row. The manufacture may select the second repair row and configure memory device 1010 (e.g., by configuring repair CAM 1015) such that no utilized repair rows are disposed between the first repair row and the second repair row and a first unutilized repair row is disposed between the first repair row and the second repair row. Controller 1020 may access (e.g., during an initialization sequence) the first unutilized repair row to leave each of the storage capacitors of the first unutilized repair row substantially holding no electrons.

In an embodiment, the manufacturer of memory device 1010 may select multiple repair rows that are not separated by at least one unutilized repair row. In this case, the primary rows being selected to be replaced by repair rows should be rows that are allowed to be neighbors in memory device 1010 (e.g., because they are not neighbors in any other DRAM on a module). Thus, the functionality of these multiple primary rows may be moved as a block of rows to the redundant area without any shielding rows between then. This is because, in this application (e.g., on a module) and for this particular memory device 1010, these primary rows are allowed to be neighbors. It should be understood that between this select block of repair rows and the rest of the repair rows there should be at least one shielding row, but shielding rows between the repair rows of this block may not be needed.

FIG. 11 is a flowchart illustrating a method of operating a memory device. One or more of the steps illustrated in FIG. 11 may be performed by, for example, memory system 100, module 200, memory system 300, memory system 1000, and/or their components. A DRAM device is configured into a first mode where the DRAM includes a memory array having a plurality of rows accessed according to a plurality of internal row addresses, the memory array comprising utilized primary rows, utilized repair rows, and unutilized repair rows (1102). For example, memory device 1010, which has utilized primary rows of primary array 1030 and utilized (e.g., utilized row 1035a) and unutilized rows (e.g., unutilized row 1035b) of repair rows 1035, may be configured into an initialization mode where external row addresses received via CA interface may be used to write values to unutilized repair rows of repair rows 1035.

While the DRAM device is in the first mode, at least one unutilized repair row is accessed (1104). For example, while memory device 1010 is in the initialization mode, controller 1020 may access an unutilized repair row (e.g., unutilized row 1035b) to leave each of the storage capacitors of the unutilized repair row substantially holding no electrons. The DRAM device is configured into a second mode (1106). For example, controller 1020 may configure memory device 1010 into an operational mode where external row addresses received via CA interface cannot be used to access the unutilized repair rows of repair rows 1035.

While the DRAM device is in the second mode, a plurality of external row addresses are received where the plurality of external addresses are selected from a first contiguous range of external row addresses, and where the unutilized repair rows, while the DRAM device is in the second mode are to not be accessible using addresses selected from the first contiguous range of external row addresses (1108). For example, while in the operational mode, memory device 1010 may not allow addresses received via CA interface 1011 to be used to accesses the unutilized repair rows (e.g., unutilized row 1035b) of repair rows 1035. While the DRAM device is in the second mode and based on a mapping mode indicator, the plurality of external row addresses are translated to corresponding ones of the plurality of internal row addresses to access the utilized primary rows and the utilized repair rows (1110). For example, while in the operational mode, and based on configuration information 1014, memory device 1010 may translate external row addresses to corresponding internal row addresses (e.g., using row mapping 1013) to access the utilized primary rows and the utilized repair rows (e.g., utilized repair row 1035a).

FIG. 12 is a flowchart illustrating a method of operating a memory device with repair rows. One or more of the steps illustrated in FIG. 12 may be performed by, for example, memory system 100, module 200, memory system 300, memory system 1000, and/or their components. A first unutilized repair row is initialized to substantially hold no electrons in the capacitors of the first unutilized repair row, where the first unutilized repair row is disposed between a first utilized repair row and a second utilized repair row (1202). For example, unutilized repair row 1035b, which is physically between utilized repair row 1035a and utilized repair row 1035c, may be initialized (e.g., by controller 1020) with values that result in the capacitors of unutilized repair row 1035b substantially holding no electrons.

A first external address of a first primary row that is redirected to a first internal address of the first utilized repair row is received (1204). For example, memory device 1010 may receive, via CA interface 1011, a first external row address that is mapped by entry 1015a in repair CAM 1015 to an internal address for repair row 1035a. A second external address of a second primary row that is redirected to a second internal address of the second utilized repair row is received (1206). For example, memory device 1010 may receive, via CA interface 1011, a second external row address that is mapped by entry 1015b in repair CAM 1015 to an internal address for repair row 1035c.

Based on a mapping mode indicator, a third external address of a third primary row is translated to a third internal address of a third row, where without the translation based on the mapping mode indicator the third external address would access a fourth primary row (1208). For example, based on configuration information 1014 (e.g., mode, programmed register value, programmed fuses, etc.), row mapping 1013 may map an external row addresses to an internal row addresses that is provided to row circuitry 1031. Row mapping 1013 may map this external row addresses to an internal row address that is not the same row in primary array 1030 that would have been accessed without the mapping.

FIG. 13 is a flowchart illustrating a method of mitigating row hammer of repair rows. One or more of the steps illustrated in FIG. 13 may be performed by, for example, memory system 100, module 200, memory system 300, memory system 1000, and/or their components. A DRAM device is configured into a repair row initialization mode (1302). For example, memory device 1010, which has utilized primary rows of primary array 1030 and utilized (e.g., utilized row 1035*a*) and unutilized rows (e.g., unutilized row 1035*b*) of repair rows 1035, may be configured into an initialization mode where external row addresses received via CA interface may be used to write values to unutilized repair rows of repair rows 1035.

While the DRAM device is in the repair row initialization mode, at least one repair row is initialized to not be holding electrons (1304). For example, while memory device 1010 is in the initialization mode, controller 1020 may access an unutilized repair row (e.g., unutilized row 1035*b*) to leave each of the storage capacitors of the unutilized repair row substantially holding no electrons. The DRAM device is configured into an operational mode (1306). For example, controller 1020 may configure memory device 1010 into an operational mode where external row addresses received via CA interface cannot be used to access the unutilized repair rows of repair rows 1035.

While the DRAM device is in the operational mode, a utilized repair row disposed next to an unutilized repair row that has been initialized to not be holding electrons is activated (1308). For example, while memory device 1010 is in an operational mode, a command (e.g., activate-ACT) and associated address that activates utilized repair row 1035*a*, which is disposed next to unutilized repair row 1035*b*, may be received via CA interface 1011.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, module 200, memory system 300, and/or memory system 1000, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 14:
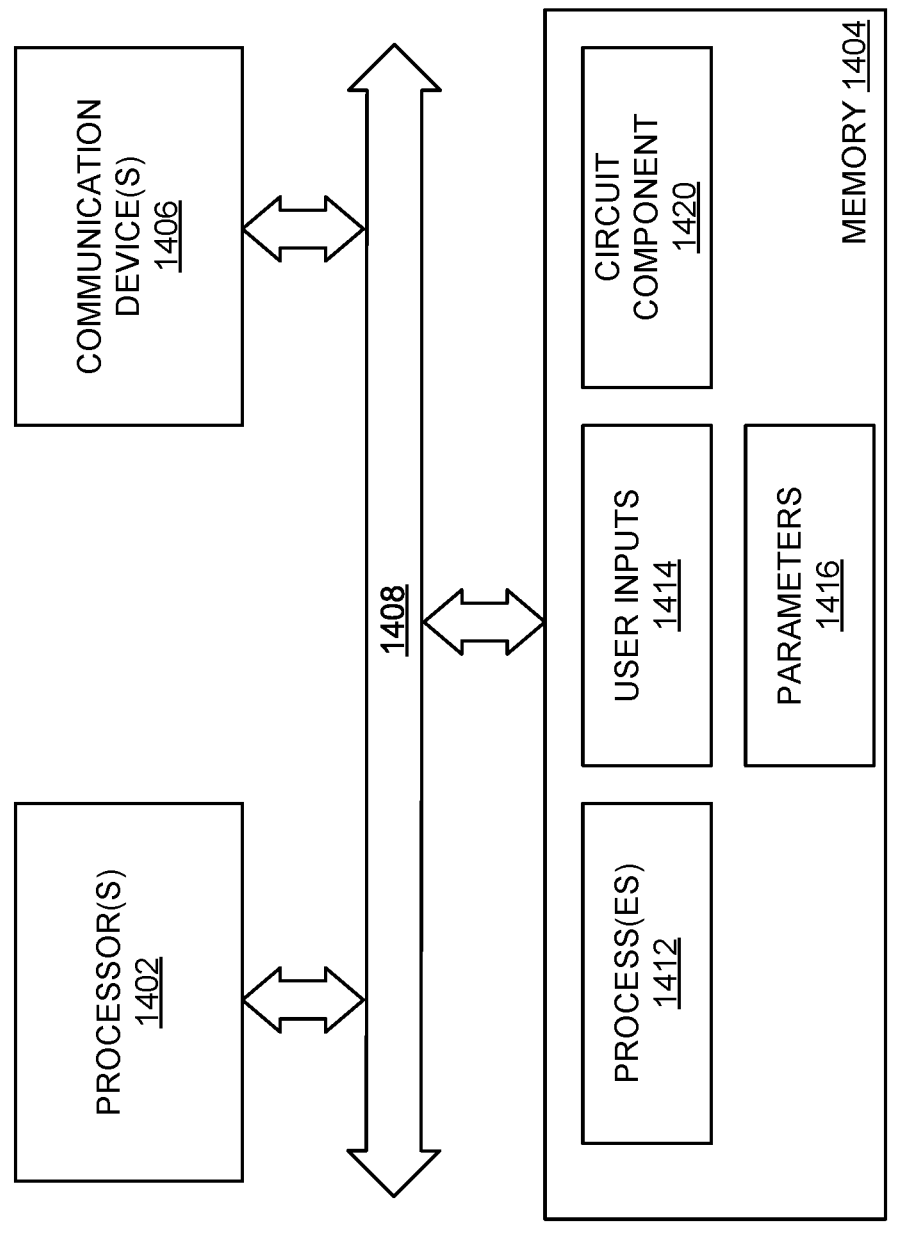
FIG. 14 is a block diagram of a processing system.

FIG. 14 is a block diagram illustrating one embodiment of a processing system 1400 for including, processing, or generating, a representation of a circuit component 1420. Processing system 1400 includes one or more processors 1402, a memory 1404, and one or more communications devices 1406. Processors 1402, memory 1404, and communications devices 1406 communicate using any suitable type, number, and/or configuration of wired and/or wireless connections 1408.

Processors 1402 execute instructions of one or more processes 1412 stored in a memory 1404 to process and/or generate circuit component 1420 responsive to user inputs 1414 and parameters 1416. Processes 1412 may be any suitable electronic design automation (EDA) tool or portion thereof used to design, simulate, analyze, and/or verify electronic circuitry and/or generate photomasks for electronic circuitry. Representation 1420 includes data that describes all or portions of memory system 100, module 200, memory system 300, and/or memory system 1000, and their components, as shown in the Figures.

Representation 1420 may include one or more of behavioral, register transfer, logic component, transistor, and layout geometry-level descriptions. Moreover, representation 1420 may be stored on storage media or communicated by carrier waves.

Data formats in which representation 1420 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1414 may comprise input parameters from a keyboard, mouse, voice recognition interface, microphone and speakers, graphical display, touch screen, or other type of user interface device. This user interface may be distributed among multiple interface devices. Parameters 1416 may include specifications and/or characteristics that are input to help define representation 1420. For example, parameters 1416 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1404 includes any suitable type, number, and/or configuration of non-transitory computer-readable storage media that stores processes 1412, user inputs 1414, parameters 1416, and circuit component 1420.

Communications devices 1406 include any suitable type, number, and/or configuration of wired and/or wireless devices that transmit information from processing system 1400 to another processing or storage system (not shown) and/or receive information from another processing or storage system (not shown). For example, communications devices 1406 may transmit circuit component 1420 to another system. Communications devices 1406 may receive processes 1412, user inputs 1414, parameters 1416, and/or circuit component 1420 and cause processes 1412, user inputs 1414, parameters 1416, and/or circuit component 1420 to be stored in memory 1404.

Implementations discussed herein include, but are not limited to, the following examples:

Example 1: A memory module, comprising: a command/address interface to receive a first row address; a first dynamic random access memory (DRAM) device including a first memory array, the first DRAM device to receive the first row address and to, based on the first row address, access a first row in the first memory array having a first internal row address, the first row to be physically next to a first neighboring row having a first internal neighboring row address; and, a second DRAM device including a second memory array, the second DRAM device to receive the first row address and to, based on the first row address, access a second row in the second memory array having a second internal row address, the second row to be physically next to a second neighboring row having a second internal neighboring row address, wherein a first address that the first DRAM receives that maps to the first internal neighboring row address and a second address that the second DRAM receives that maps to the second internal neighboring row address are to be not equal.

Example 2: The memory module of example 1, wherein the first DRAM device comprises first row address remapping circuitry to map the first row address to the first internal row address and the second DRAM device comprises second address remapping circuitry to map the first row address to the second internal row address.

Example 3: The memory module of example 2, wherein the first address remapping permutes the first row address using a first permutation function when mapping the first row address to the first internal row address and the second address remapping circuitry permutes the first row address using a second permutation function when mapping the first row address to the second internal row address, wherein the first permutation function and the second permutation function are not equivalent.

Example 4: The memory module of example 2, wherein the first row address remapping circuitry circularly shifts the first row address by a first number of bits when mapping the first row address to the first internal row address and the second row address remapping circuitry circularly shifts the first row address by a second number of bits when mapping the first row address to the second internal row address, wherein the first number of bits and the second number of bits are not functionally equivalent.

Example 5: The memory module of example 2, wherein the first row address remapping circuitry comprises first linear feedback shift register (LFSR) circuitry and the second row address remapping circuitry comprises second LFSR circuitry, the first LFSR circuitry and the second LFSR circuitry configured to produce different outputs when provided a same input value.

Example 6: The memory module of example 3, wherein the first DRAM device and the second DRAM device, when respectively placed in a first mode, are to respectively use the first permutation function and when respectively placed in a second mode, are to respectively use the second permutation function.

Example 7: The memory module of example 3, further comprising a register that determines a permutation function to be used.

Example 8: A dynamic random access memory (DRAM) device, comprising: a memory array having a plurality of rows accessed according to a plurality of internal row addresses; a command/address interface to receive a plurality of external row addresses; and, externally configurable row address mapping circuitry to, based on a mapping mode indicator, select a one of a plurality of mapping modes, each of the plurality of mapping modes to provide unique, among the plurality of mapping modes, translations of the plurality of external row addresses to corresponding ones of the plurality of internal row addresses.

Example 9: The DRAM device of example 8, wherein each of the plurality of rows has a corresponding at least one neighboring row that is physically next to each respective one of the plurality of rows, and each of the plurality of mapping modes provide unique, among the plurality of mapping modes, translations of the plurality of external row addresses to corresponding ones of the plurality of internal row addresses of the at least one neighboring row.

Example 10: The DRAM device of example 8, wherein the plurality of mapping modes provide unique, among the plurality of mapping modes, permutation functions to translate the plurality of external row addresses to corresponding ones of the plurality of internal row addresses.

Example 11: The DRAM device of example 8, wherein the plurality of mapping modes provide unique, among the plurality of mapping modes, circular shift functions to translate the plurality of external row addresses to corresponding ones of the plurality of internal row addresses.

Example 12: The DRAM device of example 8, wherein the plurality of mapping modes use unique, among the plurality of mapping modes, linear feedback shift register functions when translating the plurality of external row addresses to corresponding ones of the plurality of internal row addresses.

Example 13: The DRAM device of example 8, wherein the command/address interface is to receive a command that determines the mapping mode indicator.

Example 14: The DRAM device of example 8, wherein the mapping mode indicator is nonvolatile.

Example 15: A method of operating a memory module, comprising: receiving, via a command/address interface, a first row address; receiving, by a first dynamic random access memory (DRAM) device on the memory module that includes a first memory array, the first row address; based on the first row address, accessing a first row in the first memory array that has a first internal row address, the first row to be physically next to a first neighboring row having a first internal neighboring row address; receiving, by a second DRAM device on the memory module that includes a second memory array, the first row address; and, based on the first row address, accessing a second row in the second memory array that has a second internal row address, the second row to be physically next to a second neighboring row having a second internal neighboring row address where a first external row address received via the command/address interface that maps to the first internal neighboring row address and a second external row address received via the command/address interface that maps to the second internal neighboring row address are not equal.

Example 16: The method of example 15, further comprises: mapping, by first DRAM device, the first row address to the first internal row address; and, mapping, by the second DRAM device the first row address to the second internal row address.

Example 17: The method of example 16, wherein the mapping, by the first DRAM device, of the first row address to the first internal row address, permutes the first row address using a first permutation function, and the mapping, by the second DRAM device, of the second row address to the second internal row address, permutes the first row address using a second permutation function.

Example 18: The method of example 16, wherein the mapping, by the first DRAM device, of the first row address to the first internal row address circularly shifts the first row address by a first number of bits, and the mapping, by the second DRAM device, of the second row address to the second internal row address circularly shifts the first row address by a second number of bits where the first number of bits and the second number of bits produce different outputs.

Example 19: The method of example 16, wherein the mapping, by the first DRAM device, of the first row address to the first internal row address uses a first linear feedback shift register (LFSR) function, and the mapping, by the second DRAM device, of the second row address to the second internal row address uses a second LFSR function, where the first LFSR function and the second LFSR function are configured to produce different outputs when provided a same input value.

Example 20: The method of example 17, wherein the first DRAM device and the second DRAM device, when respectively placed in a first mode, respectively use the first permutation function and when respectively placed in a second mode, respectively use the second permutation function.

Example 21: A dynamic random access memory (DRAM) device, comprising: a command/address interface to receive, when the DRAM device is in a first mode, a plurality of external row addresses, the plurality of external row addresses selected from a first contiguous range of external row addresses; a memory array having a plurality of rows accessed according to a plurality of internal row addresses, the plurality of rows including an inaccessible plurality of rows that, when the DRAM device is in the first mode, are not accessible using addresses selected from the first contiguous range of external row addresses; externally configurable row address mapping circuitry to, based on a mapping mode indicator, select a one of a plurality of mapping modes, each of the plurality of mapping modes to provide unique, among the plurality of mapping modes, translations of the plurality of external row addresses to corresponding ones of the plurality of internal row addresses; and access circuitry to, when the DRAM device is in a second mode, write a first data pattern to at least one of the inaccessible plurality of rows.

Example 22: The DRAM device of example 21, wherein the inaccessible plurality of rows comprise unused repair rows.

Example 23: The DRAM device of example 21, wherein the at least one of the inaccessible plurality of rows is physically next to at least one of the plurality of rows that is accessible, when the DRAM device is in the first mode, using a first address selected from the first contiguous range of external row addresses.

Example 24: The DRAM device of example 21, wherein the at least one of the inaccessible plurality of rows is physically disposed between two of the plurality of rows that are accessible, when the DRAM device is in the first mode, using addresses selected from the first contiguous range of external row addresses.

Example 25: The DRAM device of example 21, wherein the plurality of rows includes a first row that is not in the inaccessible plurality of rows, and a first plurality of the plurality of rows that are not in the inaccessible plurality of rows, the at least one of the inaccessible plurality of rows physically disposed between the first row and the first plurality of the plurality of rows.

Example 26: The DRAM device of example 21, wherein the at least one of the inaccessible plurality of rows include a plurality of storage capacitors configured to hold electrons and the first data pattern, when written to the at least one of the inaccessible plurality of rows, leaves each of the plurality of storage capacitors substantially holding no electrons.

Example 27: The DRAM device of example 21, wherein the second mode is to be used during an initialization sequence of the DRAM device.

Example 28: A dynamic random access memory (DRAM) device, comprising: a command/address interface to receive, when the DRAM device is in a first mode, a plurality of external row addresses, the plurality of external row addresses selected from a first contiguous range of external row addresses; a memory array having a plurality of rows accessed according to a plurality of internal row addresses, the memory array comprising utilized primary rows, utilized repair rows, and unutilized repair rows, the utilized primary rows and utilized repair rows, when the DRAM device is in the first mode, to be accessible using addresses selected from the first contiguous range of external row addresses, the unutilized repair rows, when the DRAM device is in the first mode, to not be accessible using addresses selected from the first contiguous range of external row addresses; externally configurable row address mapping circuitry to, based on a mapping mode indicator, select a one of a plurality of mapping modes, each of the plurality of mapping modes to provide unique, among the plurality of mapping modes, translations of the plurality of external row addresses to corresponding ones of the plurality of internal row addresses; and unutilized repair row access circuitry to, when the DRAM device is in a second mode, access at least one of the unutilized repair rows.

Example 29: The DRAM device of example 28, wherein the unutilized repair row access circuitry is to write a first data pattern to a first unutilized row of the unutilized repair rows.

Example 30: The DRAM device of example 29, wherein the first unutilized row is physically next to a first utilized row of the utilized repair rows.

Example 31: The DRAM device of example 29, wherein the first unutilized row is physically disposed between two of the utilized repair rows.

Example 32: The DRAM device of example 29, wherein the first unutilized row is physically disposed between a first utilized row of the utilized repair rows and a first plurality of the utilized repair rows.

Example 33: The DRAM of example 29, wherein the unutilized repair rows include a plurality of storage capacitors configured to hold electrons, and the first data pattern, when written to the first unutilized row, leaves each of the plurality of storage capacitors substantially holding no electrons.

Example 34: The DRAM device of example 29, wherein the second mode is to be used during an initialization sequence of the DRAM device.

Example 35: A method of operating dynamic random access memory (DRAM) device, comprising: configuring the DRAM device into a first mode, the DRAM device having a memory array having a plurality of rows accessed according to a plurality of internal row addresses, the memory array comprising utilized primary rows, utilized repair rows, and unutilized repair rows; while the DRAM device is in the first mode, accessing at least one unutilized repair row; configuring the DRAM device into a second mode; receiving, while the DRAM device is in the second mode, a plurality of external row addresses, the plurality of external row addresses selected from a first contiguous range of external row addresses, the unutilized repair rows, while the DRAM device is in the second mode, to not be accessible using addresses selected from the first contiguous range of external row addresses; and while the DRAM device is in the second mode and based on a mapping mode indicator, translating the plurality of external row addresses to corresponding ones of the plurality of internal row addresses to access the utilized primary rows and the utilized repair rows.

Example 36: The method of example 35, wherein the unutilized repair rows include a plurality of storage capacitors configured to hold electrons, and accessing at least one unutilized repair row is to leave each of the plurality of storage capacitors substantially holding no electrons.

Example 37: The method of example 35, further comprising: selecting a first repair row to perform the functions of a first primary row; configuring the DRAM device to access the first repair row in response to addresses directed to the first primary row; and selecting a second repair row to perform the functions of a second primary row, the second repair row selected such that no utilized repair rows are disposed between the first repair row and the second repair row and a first unutilized repair row is disposed between the first repair row and the second repair row.

Example 38: The method of example 37, wherein the first unutilized repair row includes a plurality of storage capacitors configured to hold electrons, the method further comprising: accessing the first unutilized repair row to leave each of the plurality of storage capacitors substantially holding no electrons.

Example 39: The method of example 35, wherein the first unutilized repair row is physically next to the first repair row.

Example 40: The method of example 35, wherein mode setting commands received via a command/address interface are used to configure the DRAM device into the first mode and the second mode.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory module, comprising:
a command/address interface to receive a first row address;
a first dynamic random access memory (DRAM) device including a first memory array and first neighbor-refresh control circuitry, the first DRAM device to receive the first row address and to, based on the first row address, access a first row in the first memory array having a first internal row address, the first row to be physically next to a first neighboring row having a first internal neighboring row address, the first DRAM device to also, based on receiving a neighbor refresh command associated with the first row address, refresh the first neighboring row; and
a second DRAM device including a second memory array and second neighbor-refresh control circuitry, the second DRAM device to receive the first row address and to, based on the first row address, access a second row in the second memory array having a second internal row address, the second row to be physically next to a second neighboring row having a second internal neighboring row address, the second DRAM device to also, based on receiving the neighbor refresh command associated with the first row address, refresh the second neighboring row, wherein a first address that the first DRAM receives that maps to the first internal neighboring row address and a second address that the second DRAM receives that maps to the second internal neighboring row address are to be not equal.

2. The memory module of claim 1, wherein the first DRAM device comprises first row address remapping circuitry to map the first row address to the first internal row address and the second DRAM device comprises second address remapping circuitry to map the first row address to the second internal row address.

3. The memory module of claim 2, wherein the first address remapping permutes the first row address using a first permutation function when mapping the first row address to the first internal row address and the second address remapping circuitry permutes the first row address using a second permutation function when mapping the first row address to the second internal row address, wherein the first permutation function and the second permutation function are not equivalent.

4. The memory module of claim 2, wherein the first row address remapping circuitry circularly shifts the first row address by a first number of bits when mapping the first row address to the first internal row address and the second row address remapping circuitry circularly shifts the first row address by a second number of bits when mapping the first row address to the second internal row address, wherein the first number of bits and the second number of bits are not functionally equivalent.

5. The memory module of claim 2, wherein the first row address remapping circuitry comprises first linear feedback shift register (LFSR) circuitry and the second row address remapping circuitry comprises second LFSR circuitry, the first LFSR circuitry and the second LFSR circuitry configured to produce different outputs when provided a same input value.

6. The memory module of claim 3, wherein the first DRAM device and the second DRAM device, when respectively placed in a first mode, are to respectively use the first permutation function and when respectively placed in a second mode, are to respectively use the second permutation function.

7. The memory module of claim 3, further comprising a register that determines a permutation function to be used.

8. A dynamic random access memory (DRAM) device, comprising:
a memory array having a plurality of rows accessed according to a plurality of internal row addresses;
a command/address interface to receive a plurality of external row addresses; and
externally configurable row address mapping circuitry to, based on a mapping mode indicator, select a one of a plurality of mapping modes, each of the plurality of mapping modes to provide unique, among the plurality of mapping modes, translations of the plurality of external row addresses to corresponding ones of the plurality of internal row addresses; and
neighbor-refresh control circuitry to, based on the selected one of the plurality of mapping modes, provide translations of a plurality of external neighbor row refresh addresses to corresponding ones of the plurality of internal row addresses to be refreshed.

9. The DRAM device of claim 8, wherein each of the plurality of rows has a corresponding at least one neighboring row that is physically next to each respective one of the plurality of rows, and each of the plurality of mapping modes provide unique, among the plurality of mapping modes, translations of the plurality of external row addresses to corresponding ones of the plurality of internal row addresses of the at least one neighboring row.

10. The DRAM device of claim 8, wherein the plurality of mapping modes provide unique, among the plurality of mapping modes, permutation functions to translate the plurality of external row addresses to corresponding ones of the plurality of internal row addresses.

11. The DRAM device of claim 8, wherein the plurality of mapping modes provide unique, among the plurality of mapping modes, circular shift functions to translate the plurality of external row addresses to corresponding ones of the plurality of internal row addresses.

12. The DRAM device of claim 8, wherein the plurality of mapping modes use unique, among the plurality of mapping modes, linear feedback shift register functions when translating the plurality of external row addresses to corresponding ones of the plurality of internal row addresses.

13. The DRAM device of claim 8, wherein the command/address interface is to receive a command that determines the mapping mode indicator.

14. The DRAM device of claim 8, wherein the mapping mode indicator is nonvolatile.

15. A method of operating a memory module, comprising:
  receiving, via a command/address interface, a first row address;
  receiving, by a first dynamic random access memory (DRAM) device on the memory module that includes a first memory array, the first row address;
  based on the first row address, accessing a first row in the first memory array that has a first internal row address, the first row to be physically next to a first neighboring row having a first internal neighboring row address;
  receiving, by the first DRAM device and the second DRAM device, the first row address in association with a first neighbor refresh command;
  based on the first neighbor refresh command and the first row address, refreshing, by the first DRAM device, the first neighboring row;
  receiving, by a second DRAM device on the memory module that includes a second memory array, the first row address; and
  based on the first row address, accessing a second row in the second memory array that has a second internal row address, the second row to be physically next to a second neighboring row having a second internal neighboring row address where a first external row address received via the command/address interface that maps to the first internal neighboring row address and a second external row address received via the command/address interface that maps to the second internal neighboring row address are not equal; and
  based on the first neighbor refresh command and the first row address, refreshing, by the second DRAM device, the second neighboring row.

16. The method of claim 15, further comprises:
  mapping, by first DRAM device, the first row address to the first internal row address; and
  mapping, by the second DRAM device the first row address to the second internal row address.

17. The method of claim 16, wherein the mapping, by the first DRAM device, of the first row address to the first internal row address, permutes the first row address using a first permutation function, and the mapping, by the second DRAM device, of the second row address to the second internal row address, permutes the first row address using a second permutation function.

18. The method of claim 16, wherein the mapping, by the first DRAM device, of the first row address to the first internal row address circularly shifts the first row address by a first number of bits, and the mapping, by the second DRAM device, of the second row address to the second internal row address circularly shifts the first row address by a second number of bits where the first number of bits and the second number of bits produce different outputs.

19. The method of claim 16, wherein the mapping, by the first DRAM device, of the first row address to the first internal row address uses a first linear feedback shift register (LFSR) function, and the mapping, by the second DRAM device, of the second row address to the second internal row address uses a second LFSR function, where the first LFSR function and the second LFSR function are configured to produce different outputs when provided a same input value.

20. The method of claim 17, wherein the first DRAM device and the second DRAM device, when respectively placed in a first mode, respectively use the first permutation function and when respectively placed in a second mode, respectively use the second permutation function.

\* \* \* \* \*